US008879215B2

(12) United States Patent
Murakami et al.

(10) Patent No.: US 8,879,215 B2
(45) Date of Patent: Nov. 4, 2014

(54) MAGNETORESISTANCE EFFECT ELEMENT, MAGNETIC HEAD, MAGNETIC HEAD ASSEMBLY, AND MAGNETIC RECORDING AND REPRODUCING DEVICE

(71) Applicant: Kabushiki Kaisha Toshiba, Tokyo (JP)

(72) Inventors: Shuichi Murakami, Tokyo (JP); Masayuki Takagishi, Tokyo (JP); Yousuke Isowaki, Kanagawa-ken (JP); Susumu Hashimoto, Tokyo (JP); Naoki Hase, Tokyo (JP); Masaki Kado, Kanagawa-ken (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/202,694

(22) Filed: Mar. 10, 2014

(65) Prior Publication Data

US 2014/0300996 A1     Oct. 9, 2014

(30) Foreign Application Priority Data

Apr. 8, 2013   (JP) .................................. 2013-080736

(51) Int. Cl.
    *G11B 5/39*     (2006.01)
    *G11B 5/48*     (2006.01)

(52) U.S. Cl.
    CPC ............ *G11B 5/3912* (2013.01); *G11B 5/4833* (2013.01)
    USPC .................................................... 360/324.12

(58) Field of Classification Search
    USPC .................. 360/125.03, 125.3, 246.1, 324.1, 360/324.12
    See application file for complete search history.

(56) References Cited

U.S. PATENT DOCUMENTS

| | | | | |
|---|---|---|---|---|
| 7,336,453 B2 * | 2/2008 | Hasegawa et al. | ........ | 360/324.12 |
| 7,672,092 B2 * | 3/2010 | Tsuchiya et al. | ......... | 360/324.12 |
| 7,800,866 B2 * | 9/2010 | Ide et al. | ..................... | 360/324.1 |
| 8,325,442 B2 * | 12/2012 | Koui et al. | ..................... | 360/128 |
| 8,675,319 B2 * | 3/2014 | He et al. | ..................... | 360/324.11 |
| 2009/0296283 A1 | 12/2009 | Mizuno et al. | | |

FOREIGN PATENT DOCUMENTS

| | | |
|---|---|---|
| JP | 2007-173572 | 7/2007 |
| JP | 2009-289390 | 12/2009 |

OTHER PUBLICATIONS

Okamoto, S. et al., "Large Negative Magnetic Anisotropy in Epitaxially Grown Fe/Co Multilayer Films", J. Magn. Soc. Jpn. 33, (2009), pp. 451-454.

(Continued)

*Primary Examiner* — Angel Castro
(74) *Attorney, Agent, or Firm* — Nixon & Vanderhye, P.C.

(57) ABSTRACT

According to one embodiment, a magnetoresistance effect element includes a first shield, a second shield, a stacked unit, and a hard bias unit. The stacked unit includes a first magnetic layer provided between the first shield and the second shield, a second magnetic layer provided between the first magnetic layer and the second shield, and an intermediate layer provided between the and second magnetic layers. The hard bias unit is provided between the first shield and the second shield to be arranged with the stacked unit. A crystal orientation plane of the first magnetic layer in a film surface perpendicular direction is a cubic (110) plane. The first magnetic layer includes a first stacked body including a first Fe layer and a first Co layer stacked along the first direction, and a first Heusler alloy layer stacked with the first stacked body along the first direction.

19 Claims, 8 Drawing Sheets

(56) References Cited

OTHER PUBLICATIONS

Hase et al., "Enhancement of current-perpendicular-to plane giant magnetoresistance by insertion of Co50Fe50 layers at the Co2Mn(Ga0.5Sn0.5)/Ag interface," Journal of Applied Physics, United States, No. 109, 07E112, Mar. 2011, pp. 1-3.

Jung et al., "Enhancement of interfacial specific resistance by insertion of Fe(001) layers between alternate monatomic [Fe/Co] n superlattices and Ag spacer," Journal of Applied Physics, United States, No. 111, 07B707, Mar. 2012, pp. 1-3.

Office Action mailed Jul. 9, 2014 in counterpart Japanese Patent Application No. 2013-080736 and English-language translation thereof.

* cited by examiner

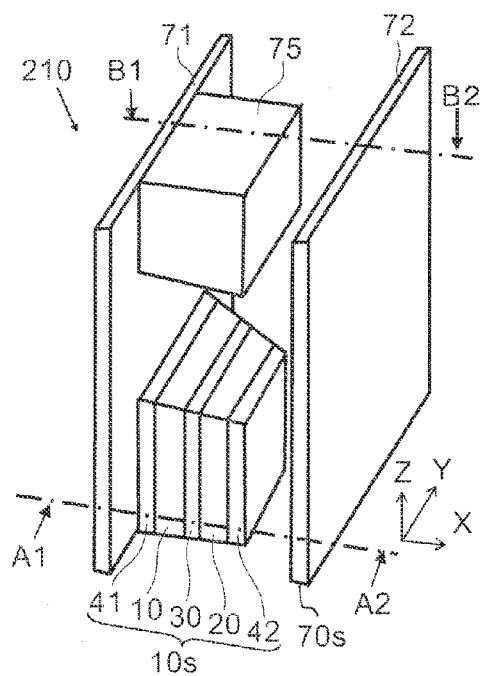
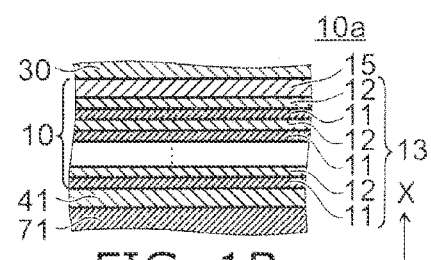
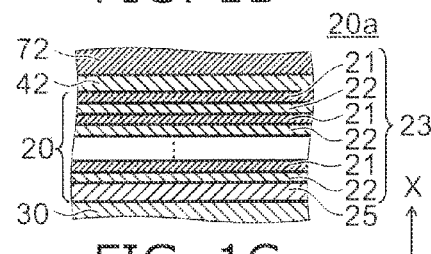
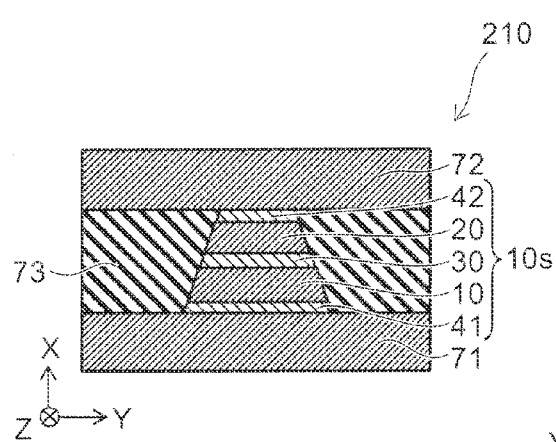
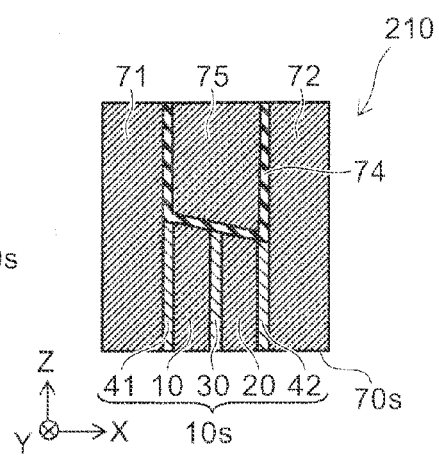

MAGNETORESISTANCE EFFECT ELEMENT, MAGNETIC HEAD, MAGNETIC HEAD ASSEMBLY, AND MAGNETIC RECORDING AND REPRODUCING DEVICE

CROSS-REFERENCE TO RELATED APPLICATIONS

This application is based upon and claims the benefit of priority from Japanese Patent Application No. 2013-080736, filed on Apr. 8, 2013; the entire contents of which are incorporated herein by reference.

FIELD

Embodiments described herein relate generally to a magnetoresistance effect element, a magnetic head, a magnetic head assembly, and a magnetic recording and reproducing device.

BACKGROUND

In a magnetic recording and reproducing device, information that is stored in a magnetic recording medium such as a hard disk drive, etc., is reproduced by a magnetoresistance effect magnetic head. To increase the recording density, a low-noise reproducing sensor (a magnetoresistance effect magnetic head) that has high sensitivity, i.e., a large resistance change ratio, is desirable.

BRIEF DESCRIPTION OF THE DRAWINGS

FIG. 1A to FIG. 1E are schematic views illustrating a magnetoresistance effect element according to a first embodiment;

DETAILED DESCRIPTION

Figure 2:
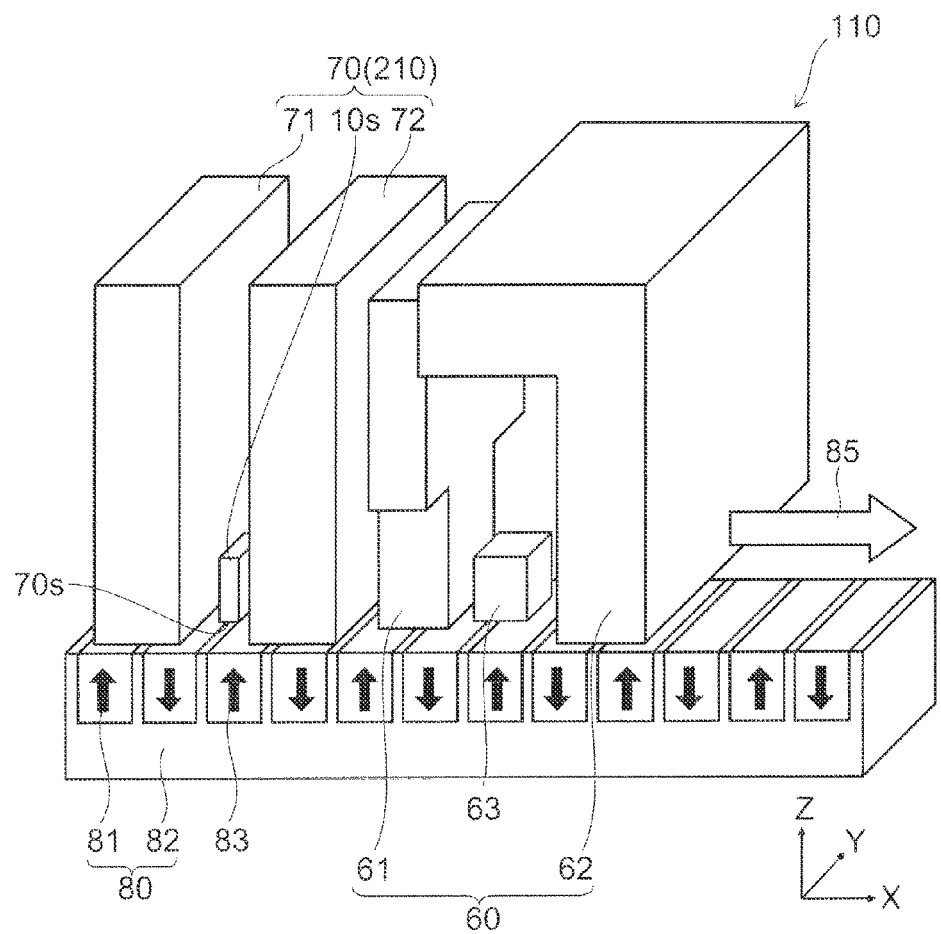
FIG. 2 is a schematic perspective view illustrating the magnetic head to which the magnetoresistance effect element according to the first embodiment is mounted.

According to one embodiment, a magnetoresistance effect element includes a first shield, a second shield, a stacked unit, and a hard bias unit. The second shield is separated form the first shield in a first direction. The stacked unit includes a first magnetic layer provided between the first shield and the second shield, a magnetization of the first magnetic layer being changeable, a second magnetic layer provided between the first magnetic layer and the second shield, a magnetization of the second magnetic layer being changeable, and an intermediate layer provided between the first magnetic layer and the second magnetic layer. The hard bias unit is provided between the first shield and the second shield to be arranged with the stacked unit in a second direction intersecting the first direction. A crystal orientation plane of the first magnetic layer in a film surface perpendicular direction is a cubic (110) plane. The first magnetic layer includes a first stacked body including a first Fe layer and a first Co layer stacked with the first Fe layer along the first direction, and a first Heusler alloy layer stacked with the first stacked body along the first direction. A thickness of the first Fe layer is not less than 0.3 nanometers and not more than 0.6 nanometers. A thickness of the first Co layer is not less than 0.3 nanometers and not more than 0.6 nanometers.

According to one embodiment, a magnetoresistance effect element includes a first shield, a second shield, a first magnetic layer, a second magnetic layer, an intermediate layer, an antiferromagnetic layer, and an insulating layer. The first shield includes a first portion, a second portion separated from the first portion in a first direction, and a third portion provided between the first portion and the second portion. The second shield includes a fourth portion separated from the first portion in a second direction intersecting the first direction, a fifth portion separated from the fourth portion in the first direction and separated from the second portion in the second direction, and a sixth portion provided between the fourth portion and the fifth portion. The first magnetic layer is provided between the first portion and the fourth portion, a magnetization of the first magnetic layer being changeable. The second magnetic layer includes a seventh portion provided between the first magnetic layer and the fourth portion, an eighth portion provided between the second portion and the fifth portion, and a ninth portion provided between the third portion and the sixth portion. The intermediate layer is provided between the first magnetic layer and the seventh portion. The antiferromagnetic layer is provided between the eighth portion and the fifth portion. The insulating layer is provided between the antiferromagnetic layer and the fifth portion. A crystal orientation plane of the first magnetic layer in a film surface perpendicular direction is a cubic (110) plane. The first magnetic layer includes a first stacked body including a first Fe layer stacked with a first Co layer along the second direction, and a first Heusler alloy layer stacked with the first stacked body along the second direction. A thickness of the first Fe layer is not less than 0.3 nanometers and not more than 0.6 nanometers. A thickness of the first Co layer is not less than 0.3 nanometers and not more than 0.6 nanometers.

According to one embodiment, a magnetic head includes a magnetoresistance effect element. The element includes a first shield, a second shield, a stacked unit, and a hard bias unit. The second shield is separated form the first shield in a first direction. The stacked unit includes a first magnetic layer provided between the first shield and the second shield, a magnetization of the first magnetic layer being changeable, a second magnetic layer provided between the first magnetic layer and the second shield, a magnetization of the second magnetic layer being changeable, and an intermediate layer provided between the first magnetic layer and the second magnetic layer. The hard bias unit is provided between the first shield and the second shield to be arranged with the stacked unit in a second direction intersecting the first direction. A crystal orientation plane of the first magnetic layer in a film surface perpendicular direction is a cubic (110) plane. The first magnetic layer includes a first stacked body including a first Fe layer and a first Co layer stacked with the first Fe layer along the first direction, and a first Heusler alloy layer stacked with the first stacked body along the first direction. A thickness of the first Fe layer is not less than 0.3 nanometers and not more than 0.6 nanometers. A thickness of the first Co layer is not less than 0.3 nanometers and not more than 0.6 nanometers.

According to one embodiment, a magnetic head includes a magnetoresistance effect element. The element includes a first shield, a second shield, a first magnetic layer, a second magnetic layer, an intermediate layer, an antiferromagnetic layer, and an insulating layer. The first shield includes a first portion, a second portion separated from the first portion in a first direction, and a third portion provided between the first portion and the second portion. The second shield includes a fourth portion separated from the first portion in a second direction intersecting the first direction, a fifth portion separated from the fourth portion in the first direction and separated from the second portion in the second direction, and a sixth portion provided between the fourth portion and the fifth portion. The first magnetic layer is provided between the first portion and the fourth portion, a magnetization of the first magnetic layer being changeable. The second magnetic layer includes a seventh portion provided between the first magnetic layer and the fourth portion, an eighth portion provided between the second portion and the fifth portion, and a ninth portion provided between the third portion and the sixth portion. The intermediate layer is provided between the first magnetic layer and the seventh portion. The antiferromagnetic layer is provided between the eighth portion and the fifth portion. The insulating layer is provided between the antiferromagnetic layer and the fifth portion. A crystal orientation plane of the first magnetic layer in a film surface perpendicular direction is a cubic (110) plane. The first magnetic layer includes a first stacked body including a first Fe layer and a first Co layer stacked with the first Co layer along the second direction, and a first Heusler alloy layer stacked with the first stacked body along the second direction. A thickness of the first Fe layer is not less than 0.3 nanometers and not more than 0.6 nanometers. A thickness of the first Co layer is not less than 0.3 nanometers and not more than 0.6 nanometers.

According to one embodiment, a magnetic head assembly includes a magnetic head, a suspension, and an actuator arm. The magnetic head includes a magnetoresistance effect element. The element includes a first shield, a second shield, a stacked unit, and a hard bias unit. The second shield is separated form the first shield in a first direction. The stacked unit includes a first magnetic layer provided between the first shield and the second shield, a magnetization of the first magnetic layer being changeable, a second magnetic layer provided between the first magnetic layer and the second shield, a magnetization of the second magnetic layer being changeable, and an intermediate layer provided between the first magnetic layer and the second magnetic layer. The hard bias unit is provided between the first shield and the second shield to be arranged with the stacked unit in a second direction intersecting the first direction. A crystal orientation plane of the first magnetic layer in a film surface perpendicular direction is a cubic (110) plane. The first magnetic layer includes a first stacked body including a first Fe layer and a first Co layer stacked with the first Fe layer along the first direction, and a first Heusler alloy layer stacked with the first stacked body along the first direction. A thickness of the first Fe layer is not less than 0.3 nanometers and not more than 0.6 nanometers. A thickness of the first Co layer is not less than 0.3 nanometers and not more than 0.6 nanometers. The suspension is configured to have the magnetic head mounted to one end of the suspension. The actuator arm is connected to one other end of the suspension. According to one embodiment, a magnetic head assembly includes a magnetic head, a suspension, and an actuator arm. The magnetic head includes a magnetoresistance effect element. The element includes a first shield, a second shield, a first magnetic layer, a second magnetic layer, an intermediate layer, an antiferromagnetic layer, and an insulating layer. The first shield includes a first portion, a second portion separated from the first portion in a first direction, and a third portion provided between the first portion and the second portion. The second shield includes a fourth portion separated from the first portion in a second direction intersecting the first direction, a fifth portion separated from the fourth portion in the first direction and separated from the second portion in the second direction, and a sixth portion provided between the fourth portion and the fifth portion. The first magnetic layer is provided between the first portion and the fourth portion, and a magnetization of the first magnetic layer is changeable. The second magnetic layer includes a seventh portion provided between the first magnetic layer and the fourth portion, an eighth portion provided between the second portion and the fifth portion, and a ninth portion provided between the third portion and the sixth portion. The intermediate layer is provided between the first magnetic layer and the seventh portion. The antiferromagnetic layer is provided between the eighth portion and the fifth portion. The insulating layer is provided between the antiferromagnetic layer and the fifth portion. A crystal orientation plane of the first magnetic layer in a film surface perpendicular direction is a cubic (110) plane. The first magnetic layer includes a first stacked body including a first Fe layer and a first Co layer stacked with the first Fe layer along the second direction, and a first Heusler alloy layer stacked with the first stacked body along the second direction. A thickness of the first Fe layer is not less than 0.3 nanometers and not more than 0.6 nanometers. A thickness of the first Co layer is not less than 0.3 nanometers and not more than 0.6 nanometers.

According to one embodiment, a magnetic recording and reproducing device includes the magnetic head assembly described above, and a magnetic recording medium including information configured to be reproduced using the magnetic head mounted in the magnetic head assembly.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1A to FIG. 1E are schematic views illustrating a magnetoresistance effect element according to a first embodiment.

FIG. 1A is a schematic perspective view. For easier viewing of the drawing in FIG. 1A, the insulating portions are not shown, and some of the components are shown as being separated from each other. FIG. 1B and FIG. 1C are cross-sectional views illustrating portions of the cross section corresponding to line A1-A2 of FIG. 1A. FIG. 1D is a cross-sectional view corresponding to line A1-A2 of FIG. 1A. FIG. 1E is a cross-sectional view corresponding to line B1-B2 of FIG. 1A.

As shown in FIG. 1A, the magnetoresistance effect element 210 according to the embodiment includes a first shield 71, a second shield 72, a stacked unit 10s, and a hard bias unit 75.

The first shield 71 and the second shield 72 are separated from each other. A direction from the first shield 71 toward the second shield 72 is taken as a stacking direction (a first direction). The first direction is taken as an X-axis direction. One direction perpendicular to the X-axis direction is taken as a Y-axis direction. A direction perpendicular to the X-axis direction and the Y-axis direction is taken as a Z-axis direction. The second direction is taken as a direction intersecting the stacking direction (the first direction). The second direction is, for example, the Z-axis direction.

The stacked unit 10s is provided between the first shield 71 and the second shield 72. The stacked unit 10s includes a first magnetic layer 10, a second magnetic layer 20, and an intermediate layer 30. The first magnetic layer 10 is provided between the first shield 71 and the second shield 72. The orientation of the magnetization of the first magnetic layer 10 is changeable. The second magnetic layer 20 is provided between the first magnetic layer 10 and the second shield 72. The orientation of the magnetization of the second magnetic layer 20 is changeable. The intermediate layer 30 is provided between the first magnetic layer 10 and the second magnetic layer 20. The direction from the first magnetic layer 10 toward the second magnetic layer 20 corresponds to the first direction (the X-axis direction).

For example, the crystal orientation plane of the first magnetic layer 10 in the film surface perpendicular direction is the cubic (110) plane. For example, the crystal orientation plane of the second magnetic layer 20 in the film surface perpendicular direction is the cubic (110) plane. The crystal orientation planes are described below.

The intermediate layer 30 is, for example, nonmagnetic. The first magnetic layer 10 and the second magnetic layer 20 are, for example, ferromagnetic. The first magnetic layer 10 and the second magnetic layer 20 are, for example, magnetization free layers. Examples of the configurations of the first magnetic layer 10 and the second magnetic layer 20 are described below.

In the example, the stacked unit 10s further includes at least one selected from a first shield-side conductive layer 41 and a second shield-side conductive layer 42. In the example, both the first shield-side conductive layer 41 and the second shield-side conductive layer 42 are provided. The first shield-side conductive layer 41 is provided between the first shield 71 and the first magnetic layer 10. The second shield-side conductive layer 42 is provided between the second magnetic layer 20 and the second shield 72.

The stacked unit 10s is a magnetoresistance effect element portion. The stacked unit 10s is, for example, a magnetoresistive film (MR film).

The hard bias unit 75 is provided between the first shield 71 and the second shield 72 to be arranged with the stacked unit 10s in the second direction (in the example, the Z-axis direction). For example, the hard bias unit 75 applies a bias magnetic field to the first magnetic layer 10 and the second magnetic layer 20. Thereby, for example, a linear response operation for the magnetic field from the magnetic recording medium can be realized. Thereby, a reproduction output that has suppressed distortion can be obtained.

As illustrated in FIG. 1D, the magnetoresistance effect element 210 further includes a first insulating unit 73. The first insulating unit 73 is provided between the first shield 71 and the second shield 72 around the stacked unit 10s. The first insulating unit 73 is provided between the first shield 71 and the second shield 72 to fill the space where the stacked unit 10s is not provided.

In the example as illustrated in FIG. 1E, the magnetoresistance effect element 210 further includes a second insulating unit 74. The second insulating unit 74 is provided between the stacked unit 10s and the hard bias unit 75. In the example, the second insulating unit 74 extends between the first shield 71 and the hard bias unit 75 and between the second shield 72 and the hard bias unit 75.

Such a magnetoresistance effect element 210 is used, for example, in a magnetic head. In such a case, as illustrated in FIG. 1A and FIG. 1E, a medium-opposing surface 70s (an air bearing surface (ABS)) is provided in the magnetoresistance effect element 210. An example of the magnetic head will now be described.

FIG. 2 is a schematic perspective view illustrating the magnetic head to which the magnetoresistance effect element according to the first embodiment is mounted.

As shown in FIG. 2, the magnetic head 110 includes a reproducing unit 70 (a reproducing head unit). In the example, the magnetic head 110 further includes a write unit 60 (a write head unit). The magnetoresistance effect element 210 according to the embodiment is used as the reproducing unit 70.

In FIG. 2, some of the components included in the reproducing unit 70 (the magnetoresistance effect element 210) are not shown.

The write unit 60 includes, for example, a major electrode 61 and a write unit return path 62. In the magnetic head 110, the write unit 60 may further include a portion that assists the writing operation such as, for example, a spin torque oscillator (STO) 63, etc. The write unit 60 may have any configuration in the magnetic head 110.

For example, the stacked unit 10s, the first shield 71, and the second shield 72 are provided in the reproducing unit 70.

The components of the reproducing unit 70 and the components of the write unit 60 are separated from each other by an insulator such as, for example, alumina, etc.

Figure 3:
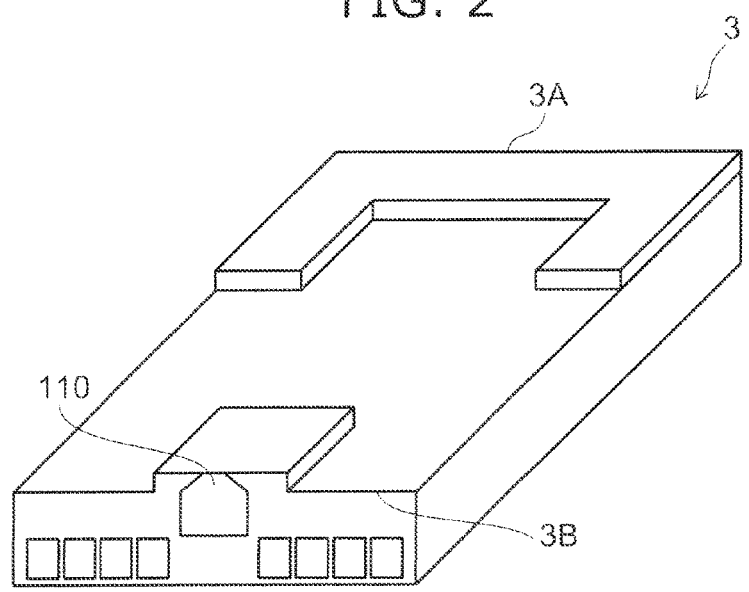
FIG. 3 is a schematic perspective view illustrating a head slider to which the magnetoresistance effect element according to the first embodiment is mounted.

FIG. 3 is a schematic perspective view illustrating a head slider to which the magnetoresistance effect element according to the first embodiment is mounted.

As shown in FIG. 3, the magnetic head 110 is mounted to a head slider 3. The head slider 3 includes, for example, $Al_2O_3$/TiC, etc. The head slider 3 moves relative to a magnetic recording medium 80 while flying over or contacting the magnetic recording medium 80 such as a magnetic disk, etc.

The head slider 3 has, for example, an air inflow side 3A and an air outflow side 3B. The magnetic head 110 is disposed at the side surface of the air outflow side 3B of the head slider 3 or the like. Thereby, the magnetic head 110 that is mounted to the head slider 3 moves relative to the magnetic recording medium 80 while flying over or contacting the magnetic recording medium 80.

As shown in FIG. 2, the magnetic recording medium 80 includes, for example, a medium substrate 82, and a magnetic recording layer 81 provided on the medium substrate 82. A magnetization 83 of the magnetic recording layer 81 is controlled by the magnetic field applied by the write unit 60; and the writing operation is thereby implemented. The magnetic recording medium 80 moves relative to the magnetic head 110 along a medium movement direction 85.

The reproducing unit 70 is disposed to oppose the magnetic recording medium 80. The reproducing unit 70 has the medium-opposing surface 70s (the air bearing surface (ABS)) opposing the magnetic recording medium 80. The magnetic recording medium 80 moves relative to the magnetic head 110 along the medium movement direction 85. The reproducing unit 70 senses the direction of the magnetization 83 of the magnetic recording layer 81. Thereby, the reproduction operation is performed. The reproducing unit 70 senses the recorded signal recorded in the magnetic recording medium 80.

For example, the Z-axis direction is the height direction. The X-axis direction corresponds to, for example, the recording track movement direction (the track direction) of the magnetic recording medium 80. The Y-axis direction corresponds to, for example, the recording track width direction (the track width direction) of the magnetic recording medium 80. The track width direction specifies the bit width.

In the embodiment, the first shield 71 and the second shield 72 are mutually interchangeable. The first magnetic layer 10 and the second magnetic layer 20 are mutually interchangeable. In the case where the first shield-side conductive layer 41 and the second shield-side conductive layer 42 are provided, the first shield-side conductive layer 41 and the second shield-side conductive layer 42 are mutually interchangeable.

In the example as shown in FIG. 1A and FIG. 1D, the side surface of the stacked unit 10s has a tapered configuration. For example, the width of the first magnetic layer 10 in the Y-axis direction is wider than the width of the second magnetic layer 20 in the Y-axis direction. As shown in FIG. 1A and FIG. 1D, for example, the width of the first magnetic layer 10 in the Z-axis direction is wider than the width of the second magnetic layer 20 in the Z-axis direction. For example, the tapered configuration of the side surface of the stacked unit 10s is formed in the patterning process of the stacked unit 10s.

For example, the first magnetic layer 10, the intermediate layer 30, and the second magnetic layer 20 are formed in this order on the first shield-side conductive layer 41 formed on the first shield 71. At this time, the tapered configuration such as that recited above is formed in the side surface of the stacked unit 10s by the patterning conditions. At this time, the first shield-side conductive layer 41 functions as a foundation layer. In the case where the second shield-side conductive layer 42 is formed on the second magnetic layer 20, the second shield-side conductive layer 42 functions as a capping layer.

In the embodiment, for example, the width of the first magnetic layer 10 in the Y-axis direction may be narrower than the width of the second magnetic layer 20 in the Y-axis direction. For example, the width of the first magnetic layer 10 in the Z-axis direction may be narrower than the width of the second magnetic layer 20 in the Z-axis direction. In other words, a tapered configuration having a tilt that is the reverse of that recited above may be formed in the side surface of the stacked unit 10s.

For example, the second magnetic layer 20, the intermediate layer 30, and the first magnetic layer 10 may be formed in this order on the second shield-side conductive layer 42 formed on the second shield 72. At this time, the tapered configuration that has the reverse tilt is formed in the side surface of the stacked unit 10s by the patterning conditions. At this time, the second shield-side conductive layer 42 functions as a foundation layer. In the case where the first shield-side conductive layer 41 is formed on the first magnetic layer 10, the first shield-side conductive layer 41 functions as a capping layer.

In the embodiment, the width of the first magnetic layer 10 in the Y-axis direction may be the same as the width of the second magnetic layer 20 in the Y-axis direction. The width of the first magnetic layer 10 in the Z-axis direction may be the same as the width of the second magnetic layer 20 in the Z-axis direction.

In the embodiment as illustrated in FIG. 1B, the first magnetic layer 10 includes a first stacked body 13 and a first Heusler alloy layer 15. The first stacked body 13 includes an Fe layer (a first Fe layer 11) and a Co layer (a first Co layer 12). The first Fe layer 11 and the first Co layer 12 are stacked with each other along the first direction (the X-axis direction) from the first magnetic layer 10 toward the second magnetic layer 20. For example, the first Fe layer 11 may be multiply provided; and the first Co layer 12 may be multiply provided. The multiple first Fe layers 11 and the multiple first Co layers 12 are stacked alternately along the first direction. The first Heusler alloy layer 15 is stacked with the first stacked body 13 along the first direction. The first Heusler alloy layer 15 contacts the first stacked body 13.

The thicknesses of the multiple first Fe layers 11 are not less than 0.3 nanometers (nm) and not more than 0.6 nm each. The thicknesses of the multiple first Co layers 12 are not less than 0.3 nm and not more than 0.6 nm each.

In the example, the first magnetic layer 10 has a first stacked configuration 10a. In the first stacked configuration 10a, the first Heusler alloy layer 15 is disposed between the first stacked body 13 and the intermediate layer 30. Also, the first Fe layer 11 is disposed at the position of the first stacked body 13 most proximal to the first shield 71. The first Co layer 12 is disposed at the position of the first stacked body 13 most proximal to the intermediate layer 30.

In the example, the number of first Fe layers 11 is the same as the number of first Co layers 12. In the embodiment, the difference between the number of first Fe layers 11 and the number of first Co layers 12 may be 1. To simplify the description hereinbelow, the number of first Fe layers 11 is taken to be the same as the number of first Co layers 12. Hereinbelow, as appropriate, one first Fe layer 11 and one first Co layer 12 adjacent to the one first Fe layer 11 may be called one pair.

In the example, the first shield-side conductive layer 41 is provided; and the first shield-side conductive layer 41 contacts the first shield 71 and one of the first Fe layers 11. The first Heusler alloy layer 15 contacts the intermediate layer 30 and one of the first Co layers 12.

On the other hand, for example, as illustrated in FIG. 1C, the second magnetic layer 20 includes a second stacked body 23 and a second Heusler alloy layer 25. The second stacked body 23 includes an Fe layer (a second Fe layer 21) and a Co layer (a second Co layer 22). The second Fe layer 21 and the second Co layer 22 are stacked with each other along the first direction. For example, the second Fe layer 21 is multiply provided; and the second Co layer 22 is multiply provided. The multiple second Fe layers 21 and the multiple second Co layers 22 are stacked alternately along the first direction. The second Heusler alloy layer 25 is stacked with the second stacked body 23 along the first direction. The second Heusler alloy layer 25 contacts the second stacked body 23.

The thicknesses of the multiple second Fe layers 21 are not less than 0.3 nm and not more than 0.6 nm each. The thicknesses of the multiple second Co layers 22 are not less than 0.3 nm and not more than 0.6 nm each.

In the example, the second magnetic layer 20 has a second stacked configuration 20a. In the second stacked configuration 20a, the second Heusler alloy layer 25 is disposed between the second stacked body 23 and the intermediate layer 30. Also, the second Fe layer 21 is disposed at the position of the second stacked body 23 most proximal to the second shield 72. The second Co layer 22 is disposed at the position of the second stacked body 23 most proximal to the intermediate layer 30.

In the example, the number of second Fe layers 21 is the same as the number of second Co layers 22. In the embodiment, the difference between the number of second Fe layers 21 and the number of second Co layers 22 may be 1. To simplify the description hereinbelow, the number of second Fe layers 21 is taken to be the same as the number of second Co layers 22. Hereinbelow, as appropriate, one second Fe layer 21 and one second Co layer 22 adjacent to the one second Fe layer 21 may be called one pair.

In the example, the second shield-side conductive layer 42 is provided; and the second shield-side conductive layer 42 contacts the second shield 72 and one of the second Fe layers 21. The second Heusler alloy layer 25 contacts the intermediate layer 30 and one of the second Co layers 22.

Other examples of the configurations of the first magnetic layer 10 and the second magnetic layer 20 are described below.

In the embodiment, the first stacked body 13 provided in the first magnetic layer 10 and the second stacked body 23 provided in the second magnetic layer 20 are, for example, iron/cobalt artificial lattices.

The first Fe layer 11 and the second Fe layer 21 include Fe layers. There are cases where an impurity is mixed into the first Fe layer 11 and the second Fe layer 21 due to, for example, the manufacturing conditions, etc. The concentration of Fe in the first Fe layer 11 and the second Fe layer 21 is, for example, 95 atomic percent (atm %) or more.

The first Co layer 12 and the second Co layer 22 include Co layers. There are cases where an impurity is mixed into the first Co layer 12 and the second Co layer 22 due to, for example, the manufacturing conditions, etc. The concentration of Co in the first Co layer 12 and the second Co layer 22 is, for example, 95 atm % or more.

The first Heusler alloy layer 15 includes Co, a first element that is at least one selected from a first group consisting of Fe, Mn, Cr, and V, and a second element that is at least one selected from a second group consisting of Si, Al, Ge, Ga, Sn, and Sb. The composition ratio of Co in the first Heusler alloy layer 15 is, for example, about 50 atm %, e.g., not less than and 40 atm % not more than 60 atm %. The composition ratio of the first element recited above in the first Heusler alloy layer 15 is, for example, about 25 atm %, e.g., not less than 20 atm % and not more than 30 atm %. The composition ratio of the second element recited above in the first Heusler alloy layer 15 is, for example, about 25 atm %, e.g., not less than 20 atm % and not more than 30 atm %.

The second Heusler alloy layer 15 includes Co, a third element that is at least one selected from a third group consisting of Fe, Mn, Cr, and V, and a fourth element that is at least one selected from a fourth group consisting of Si, Al, Ge, Ga, Sn, and Sb. The composition ratio of Co in the second Heusler alloy layer 25 is, for example, about 50 atm %, e.g., not less than 40 atm % and not more than 60 atm %. The composition ratio of the third element recited above in the second Heusler alloy layer 25 is, for example, about 25 atm %, e.g., not less than 20 atm % and not more than 30 atm %. The composition ratio of the fourth element recited above in the second Heusler alloy layer 25 is, for example, about 25%, e.g., not less than 20 atm % and not more than 30 atm %. The composition of the second Heusler alloy layer 25 may be the same as or different from the composition of the first Heusler alloy layer 15.

The thickness of the first Heusler alloy layer 15 is, for example, not less than 2 nm and not more than 7.4 nm. The thickness of the first magnetic layer 10 (e.g., the total of the thickness of the first stacked body 13 and the thickness of the first Heusler alloy layer 15) is, for example, not less than 2.6 nm and not more than 8 nm.

The thickness of the second Heusler alloy layer 25 is, for example, not less than 2 nm and not more than 7.4 nm. The thickness of the second magnetic layer 20 (e.g., the total of the thickness of the second stacked body 23 and the thickness of the second Heusler alloy layer 25) is, for example, not less than 2.6 nm and not more than 8 nm.

The intermediate layer 30 may include, for example, a nonmagnetic metal material (e.g., at least one selected from Cu and Ag), an insulating material (e.g., an oxide such as MgO, GaO, ZnO, etc.), etc. A configuration in which a fine conductive unit is provided inside an insulating layer is applicable to the intermediate layer 30. For example, a magnetic metal (e.g., at least one selected from Fe and Co) or a nonmagnetic metal (e.g., Cu, etc.) is used as the fine conductive unit.

The first magnetic layer 10 can be magnetically coupled to the second magnetic layer 20 by applying the designated thickness and the designated material to the intermediate layer 30. The first magnetic layer 10 may be magnetically coupled to the second magnetic layer 20 via the intermediate layer 30.

The first shield 71 and the second shield 72 may include, for example, a NiFe alloy, etc.

The foundation layer (e.g., one selected from the first shield-side conductive layer 41 and the second shield-side conductive layer 42) may include, for example, a nonmagnetic metal. For example, at least one selected from Ta, Ru, and Cu is used as the foundation layer. A stacked film in which layers of multiple materials are stacked may be used as the foundation layer. For example, a high MR (Magneto Resistance) ratio is obtained by using a stacked film in which a Ta layer and a Cu layer are sequentially stacked as the foundation layer.

The capping layer (e.g., one selected from the first shield-side conductive layer 41 and the second shield-side conductive layer 42) may include, for example, a nonmagnetic metal. For example, at least one selected from Ta, Ru, and Cu is used as the capping layer.

The first shield 71 and the first magnetic layer 10 can have exchange coupling by applying the designated thickness and the designated material to the first shield-side conductive layer 41. The second shield 72 and the second magnetic layer 20 can have exchange coupling by applying the designated thickness and the designated material to the second shield-side conductive layer 42. Thus, the shield may be magnetically coupled to the magnetic layer for at least one selected from the combinations of the shield and the magnetic layer.

In the embodiment, the first stacked body 13 and the first Heusler alloy layer 15 are magnetically coupled to each other. The magnetization (the magnetization direction) of the first magnetic layer 10 (e.g., the magnetization direction of the first stacked body 13 and the magnetization direction of the first Heusler alloy layer 15) changes according to the magnetic field from the magnetic recording medium 80. The second stacked body 23 and the second Heusler alloy layer 25 are magnetically coupled to each other. The magnetization direction of the second magnetic layer 20 (e.g., the magnetization direction of the second stacked body 23 and the magnetization direction of the second Heusler alloy layer 25) changes according to the magnetic field from the magnetic recording medium 80. The first magnetic layer 10 and the second magnetic layer 20 function as magnetization free layers. The reproduction output is obtained by the magnetizations of the two magnetization free layers changing according to the magnetic field of the magnetic recording medium 80.

In the embodiment, the first stacked body 13 and the second stacked body 23 have negative perpendicular magnetic anisotropy. In other words, the first stacked body 13 and the second stacked body 23 have in-plane magnetic anisotropy. In the embodiment, the stacked body that has negative perpendicular magnetic anisotropy is stacked with the Heusler alloy layer. Then, the stacked body and the Heusler alloy layer have exchange coupling.

According to investigations of the inventor of the application, it was found that oscillations due to the spin torque occur when the size of the magnetoresistance effect element is small and a high bias voltage is applied to the magnetoresistance effect element to sense with high sensitivity; and thereby, noise occurs in the reproduction output of the magnetoresistance effect element.

In the embodiment, the stacked body that has negative perpendicular magnetic anisotropy is stacked with the Heusler alloy layer; and the stacked body and the Heusler alloy layer have exchange coupling. The oscillations due to the spin torque in the magnetoresistance effect element are suppressed by such a configuration. Thereby, a high MR ratio can be maintained even when applying a high bias voltage. According to the embodiment, a highly-sensitive low-noise magnetoresistance effect element can be provided.

FIG. 4A to FIG. 4D are graphs illustrating characteristics of magnetoresistance effect elements.

Figure 4A:
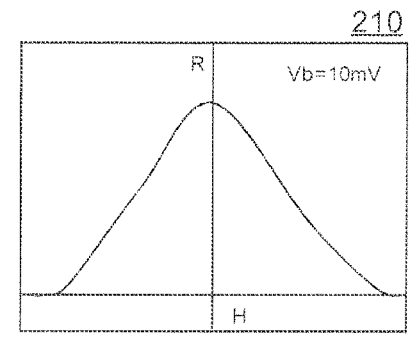
FIG. 4A to FIG. 4D are graphs illustrating characteristics of magnetoresistance effect elements.
Figure 4B:
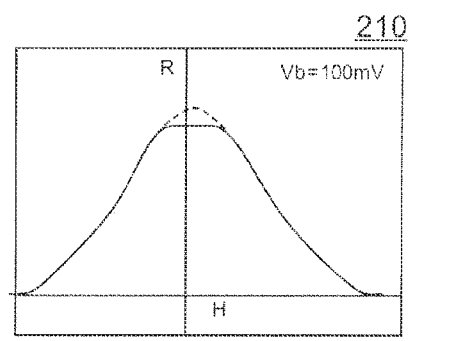
Figure 4C:
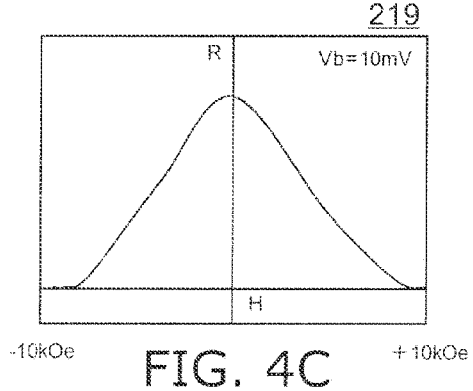
Figure 4D:
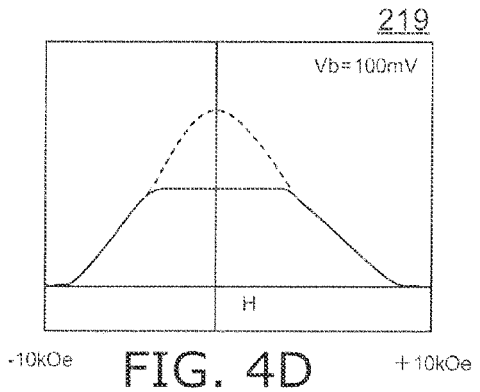

FIG. 4A and FIG. 4B illustrate examples of characteristics of the magnetoresistance effect element 210 according to the embodiment. FIG. 4C and FIG. 4D illustrate examples of characteristics of a magnetoresistance effect element 219 of a first reference example (for which the configuration is not shown). FIG. 4A and FIG. 4C illustrate the characteristics in the case where a bias voltage Vb is low (10 mV). FIG. 4B and FIG. 4D illustrate the characteristics in the case where the bias voltage Vb is high (100 mV). In these drawings, the horizontal axis is a magnetic field H (oersted (Oe)). The vertical axis is a resistance R.

In the magnetoresistance effect element 210 in the example, a foundation layer (e.g., the first shield-side conductive layer 41) is formed on the first shield 71. A stacked film of a first Ta layer having a thickness of 2 nm and a first Cu layer formed on the first Ta layer with a thickness of 1 nm is used as the foundation layer.

In the first magnetic layer 10, the first Heusler alloy layer 15 is provided on the first Cu layer recited above; and the first stacked body 13 is provided on the first Heusler alloy layer 15. A $Co_2(FeMn)Si$ alloy having a thickness of 4 nm is used as the first Heusler alloy layer 15. A stacked film of the first Fe layer 11 and the first Co layer 12 is used as the first stacked body 13. In the example, the number of pairs in the first stacked body 13 is 2. In other words, the number of first Fe layers 11 is 2; and the number of first Co layers 12 is 2. The thickness of one first Fe layer 11 is 0.5 nm. The thickness of one first Co layer 12 is 0.5 nm. The thickness of the first magnetic layer 10 is 6 nm.

A Cu layer having a thickness of 3 nm is used as the intermediate layer 30.

In the second magnetic layer 20, the second stacked body 23 is provided on the intermediate layer 30; and the second Heusler alloy layer 25 is provided on the second stacked body 23. A $Co_2(FeMn)Si$ alloy having a thickness of 4 nm is used as the second Heusler alloy layer 25. A stacked film of the second Fe layer 21 and the second Co layer 22 is used as the second stacked body 23. In the example, the number of pairs in the second stacked body 23 is 2. In other words, the number of second Fe layers 21 is 2; and the number of second Co layers 22 is 2. The thickness of one second Fe layer 21 is 0.5 nm. The thickness of one second Co layer 22 is 0.5 nm. The thickness of the second magnetic layer 20 is 6 nm.

A capping layer (e.g., the second shield-side conductive layer 42) is formed on the second magnetic layer 20. For example, a stacked film of a second Cu layer having a thickness of 1 nm and a second Ta layer formed on the second Cu layer with a thickness of 2 nm is used as the capping layer.

The crystal orientation is cubic (110) for the first magnetic layer 10 and the second magnetic layer 20. In the example, the orientation is preferentially in the (110) plane to form close-packed plane stacking.

On the other hand, the first stacked body 13 and the second stacked body 23 are not provided in the magnetoresistance effect element 219 of the first reference example. In other words, the first Heusler alloy layer 15 is provided on the first Cu layer of the foundation layer; the intermediate layer 30 is provided on the first Heusler alloy layer 15; the second Heusler alloy layer 25 is provided on the intermediate layer 30; and the second Cu layer of the capping layer is provided on the second Heusler alloy layer 25.

In the magnetoresistance effect element 210 according to the embodiment as shown in FIG. 4A, the resistance R changes with respect to the change of the magnetic field H in the case where the bias voltage Vb is low. In the example, the resistance R is highest when the magnetic field H is 0.

Similarly, in the magnetoresistance effect element 219 of the first reference example as shown in FIG. 4C, the resistance R changes with respect to the change of the magnetic field H in the case where the bias voltage Vb is low.

However, in the case where the bias voltage Vb is high in the magnetoresistance effect element 219 of the first reference example as shown in FIG. 4D, the resistance R decreases greatly when the absolute value of the magnetic field H is low. This is because the output decreases due to the spin torque in the magnetoresistance effect element 219.

Conversely, in the magnetoresistance effect element 210 according to the embodiment as shown in FIG. 4B, the decrease of the resistance R when the absolute value of the magnetic field H is low is suppressed even in the case where the bias voltage Vb is high. This is because the spin torque when using the high bias voltage is suppressed because the stacked body that has negative perpendicular magnetic anisotropy is used in the magnetoresistance effect element 210.

Thus, according to the embodiment, the oscillations due to the spin torque are suppressed; and a high MR ratio can be maintained even when applying the high bias voltage. According to the embodiment, a highly-sensitive low-noise magnetoresistance effect element can be provided.

In the embodiment, a configuration in which negative perpendicular magnetic anisotropy is obtained is applied to the first stacked body 13 and the second stacked body 23. Examples of experimental results of the relationship between the magnetic anisotropy and the conditions of the Fe layers and the Co layers included in these stacked bodies will now be described.

The samples of the experiment are as follows. The first Cu layer having a thickness of 2 nm is provided on the first Ta layer having a thickness of 4 nm; and a stacked body of an Fe layer and a Co layer is provided on the first Cu layer. The second Cu layer having a thickness of 2 nm is provided on the stacked body; and the second Ta layer having a thickness of 3 nm is provided on the second Cu layer. An iron (pure iron) target of not less than 3N is used to form the Fe layer. A pure cobalt target is used to form the Co layer. By using these targets, the Fe layer and the Co layer are formed by DC magnetron sputtering. The film formation rate is about 0.007 nm/second (0.07 angstrom/second). The thicknesses of the Fe layers and the thicknesses of the Co layers described below are values obtained by converting the film formation rate.

In the first sample, the thickness of the Fe layer is 0.1 nm; and the thickness of the Co layer is 0.1 nm. The number of stacks (which is equal to both the number of Fe layers and the number of Co layers) is 10. In this case, the thickness of the stacked body is 2 nm.

In the second sample, the thickness of the Fe layer is 0.2 nm; and the thickness of the Co layer is 0.2 nm. The number of stacks is 10. In this case, the thickness of the stacked body is 4 nm.

In the third sample, the thickness of the Fe layer is 0.3 nm; and the thickness of the Co layer is 0.3 nm. The number of stacks is 6. In this case, the thickness of the stacked body is 3.6 nm.

In the fourth sample, the thickness of the Fe layer is 0.4 nm; and the thickness of the Co layer is 0.4 nm. The number of stacks is 5. In this case, the thickness of the stacked body is 4 nm.

In the fifth sample, the thickness of the Fe layer is 0.5 nm; and the thickness of the Co layer is 0.5 nm. The number of stacks is 4. In this case, the thickness of the stacked body is 4 nm.

In the sixth sample, the thickness of the Fe layer is 0.6 nm; and the thickness of the Co layer is 0.6 nm. The number of stacks is 3. In this case, the thickness of the stacked body is 3.6 nm.

The magnetization easy direction was examined using the magneto-optic Kerr effect for these samples; and the results are as follows. In the first sample, the magnetization easy direction is perpendicular to the layer surface of the stacked body, that is, positive perpendicular magnetic anisotropy is obtained. In the second sample, a distinct magnetic anisotropy is not observed. In the third to sixth samples, the magnetization easy direction is parallel to the layer surface of the stacked body, that is, negative perpendicular magnetic anisotropy is obtained.

From the experimental results recited above, it can be seen that negative perpendicular magnetic anisotropy is obtained when the thickness of the Fe layer is not less than 0.3 nm and the thickness of the Co layer is not less than 0.3 nm. Also, in the least, negative perpendicular magnetic anisotropy is obtained when the thickness of the Fe layer is not more than 0.6 nm and the thickness of the Co layer is not more than 0.6 nm.

Therefore, in the embodiment, the thicknesses of the multiple first Fe layers 11 are set to be not less than 0.3 nm and not more than 0.6 nm each; and the thicknesses of the multiple first Co layers 12 are set to be not less than 0.3 nm and not more than 0.6 nm each. The thicknesses of the multiple second Fe layers 21 are set to be not less than 0.3 nm and not more than 0.6 nm each; and the thicknesses of the multiple second Co layers 22 are set to be not less than 0.3 nm and not more than 0.6 nm each. Thereby, negative perpendicular magnetic anisotropy is obtained; and the oscillations due to the spin torque are suppressed.

In the first stacked body 13, the number of pairs of the first Fe layer 11 and the first Co layer 12 is not less than 1. Accordingly, it is favorable for the thickness of the first stacked body 13 to be 0.6 nm or more. It is favorable for the thickness of the first Heusler alloy layer 15 to be 2.0 nm or more. Thereby, a high MR ratio is obtained. Accordingly, for example, it is favorable for the thickness of the first magnetic layer 10 to be 2.6 nm or more. On the other hand, the thickness of the element becomes excessively thick when the thickness of the first magnetic layer 10 becomes excessively thick. It is favorable for the thickness of the first magnetic layer 10 to be 8 nm or less.

Similarly, in the second stacked body 23, the number of pairs of the second Fe layer 21 and the second Co layer 22 is not less than 1. Accordingly, it is favorable for the thickness of the second stacked body 23 to be 0.6 nm or more. Similarly, it is favorable for the thickness of the second Heusler alloy layer 25 to be 2.0 nm or more. Accordingly, for example, it is favorable for the thickness of the second magnetic layer 20 to be 2.6 nm or more. Further, it is favorable for the thickness of the second magnetic layer 20 to be 8 nm or less.

For example, in a second reference example in which an $Fe_{50}Co_{50}$ alloy layer having a thickness of 1 nm is used instead of the stacked body and a $Co_2$(FeMn)Si alloy having a thickness of 5 nm is used as the Heusler alloy layer, the MR ratio is higher than that of the case where $Fe_{50}Co_{50}$ alloy layer is not used because the lattice matching is good. However, the suppression effect of the spin torque cannot be obtained for the $Fe_{50}Co_{50}$ alloy layer or for the $Co_2$(FeMn)Si alloy layer because an anisotropic magnetic field is not obtained.

Conversely, in the embodiment, good lattice matching is obtained due to the first stacked body 13 and the second stacked body 23; and a high MR ratio is obtained even in the case where a thin Heusler alloy layer (e.g., the $Co_2$(FeMn)Si alloy layer) is used. Then, the suppression effect of the spin torque is obtained due to the effect of the negative perpendicular magnetic anisotropy even in the case of a practical high bias voltage. Thereby, a high output can be realized.

The high MR ratio can be realized for the $Co_2$(FeMn)Si alloy by improving the degree of the ordering of the crystalline phase of the Heusler alloy layer. In the embodiment, the ordering of the crystal of the Heusler alloy layer occurs due to the template effect of the stacked body of the Fe layer and the Co layer; and as a result, a high MR ratio is obtained.

First, regarding the crystal orientations of the first stacked body 13 and the second stacked body 23 (the stacked films of the Fe layers and the Co layers) according to the embodiment, the characteristics of a layer of an FeCo material will be described. Namely, examples of experimental results of the difference of the characteristics of the magnetization free layer between when a layer of an FeCo material is stacked or is not stacked in the Heusler alloy layer will be described.

In a seventh sample and an eighth sample recited below, the first Cu layer having a thickness of 5 nm is provided on the first Ta layer having a thickness of 3 nm; and a first layer is provided on the first Cu layer. The second Cu layer having a thickness of 3 nm is provided on the first layer. A second layer is provided on the second Cu layer. A third Cu layer having a thickness of 1 nm is provided on the second layer; and the second Ta layer having a thickness of 2 nm is provided on the third Cu layer.

In the seventh sample, CFMS layers having a thickness of 4 nm are used respectively as the first layer and the second layer recited above. The CFMS layers are, for example, $Co_2$(FeMn)Si layers.

In the eighth sample, stacked films of a first FeCo layer having a thickness of 0.5 nm, a CFMS layer having a thickness of 3 nm provided on the first FeCo layer, and a second FeCo layer having a thickness of 0.5 nm provided on the CFMS layer are used respectively as the first layer and the second layer recited above. The existence/absence of the FeCo material layers in the first layer and the second layer is different between the seventh sample and the eighth sample.

In a ninth sample and a tenth sample recited below, the first Cu layer having a thickness of 2 nm is provided on the first Ta layer having a thickness of 2 nm; and a third layer is provided on the first Cu layer. A Ru layer having a thickness of 0.9 nm is provided on the third layer. An FeCo layer having a thickness of 2 nm is provided on the Ru layer. An IrMn layer having a thickness of 7 nm is provided on the FeCo layer. The second Cu layer having a thickness of 1 nm is provided on the IrMn layer. The second Ta layer having a thickness of 2 nm is provided on the second Cu layer. A Ru layer having a thickness of 15 nm is provided on the second Ta layer.

In the ninth sample, as the third layer recited above, a stacked film of a first CFMS layer having a thickness of 4 nm, a Cu layer having a thickness of 3 nm provided on the first CFMS layer, and a second CFMS layer having a thickness of 4 nm provided on the Cu layer is used.

In the tenth sample, as the third layer recited above, a stacked film of the first CFMS layer having a thickness of 4 nm, the first FeCo layer having a thickness of 0.5 nm provided on the first CFMS layer, a Cu layer having a thickness of 3 nm provided on the first FeCo layer, the second FeCo layer having a thickness of 0.5 nm provided on the Cu layer, and the second CFMS layer having a thickness of 3 nm provided on the second FeCo layer is used. The existence/absence of the FeCo material layers in the third layer recited above is different between the ninth sample and the tenth sample. The ninth sample and the tenth sample correspond to a so-called top spin-valve structure.

In the seventh to tenth samples recited above, heat treatment at 290° C. in a magnetic field of 6.5 kOe is performed after the film formation. An element resistance RA ($\Omega \cdot \mu m^2$) and an MR ratio dR/R (%) are evaluated for these samples. The evaluation results are as follows.

In the seventh sample, the element resistance RA is 0.10$\Omega \cdot \mu m^2$; and the MR ratio is 1.80%. In the eighth sample, the element resistance RA is 0.09$\Omega \cdot \mu m^2$; and the MR ratio is 2.17%. Comparing these samples, it can be seen that a higher MR ratio is obtained when the FeCo layers is used (the eighth sample) than when the FeCo layer is not used (the seventh sample).

In the ninth sample, the element resistance RA is 0.10$\Omega \cdot \mu m^2$; and the MR ratio is 2.21%. In the tenth sample, the element resistance RA is 0.10$\Omega \cdot \mu m^2$; and the MR ratio is 2.72%. Comparing these sample as well, it can be seen that a higher MR ratio is obtained when the FeCo layers is used (the tenth sample) than when the FeCo layer is not used (the ninth sample). Although it may be considered that the difference of the MR ratio occurs due to the quality of the antiparallel magnetization state, it is considered from the evaluation results of the seventh to tenth samples that the high MR ratio is obtained by using the FeCo layer regardless of the state of the orientation of the magnetization.

It is considered that the increase of the MR ratio by using the FeCo layer in the results recited above is because the template effect described below is obtained by using the FeCo layer.

Figure 5A:
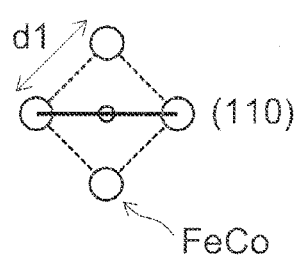
FIG. 5A and FIG. 5B are schematic views illustrating lattices of materials of the magnetoresistance effect element.
Figure 5B:
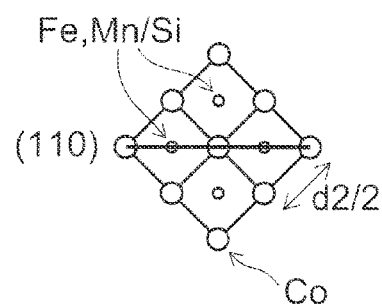

FIG. 5A and FIG. 5B are schematic views illustrating lattices of materials of the magnetoresistance effect element.

FIG. 5A shows the lattice of FeCo of the (110) orientation. FIG. 5B shows the lattice of $Co_2(FeMn)Si$ of the (110) orientation.

In the FeCo shown in FIG. 5A, a lattice length d1 (the lattice constant) is 0.284 nm. On the other hand, ½ of a lattice length d2 of the $Co_2(FeMn)Si$ shown in FIG. 5B is about 0.28 nm. Accordingly, the misfit of the lattice lengths of these materials is about 1.5% and is extremely small.

In other words, the lattice length when the FeCo material is preferentially oriented with the (110) plane in the film surface perpendicular direction matches the lattice length when the Heusler alloy is preferentially oriented with the (110) plane in the film surface perpendicular direction. In other words, good lattice matching is obtained.

By experiments of the inventor of the application, it was found that substantially the same lattice length as the lattice length d1 of the FeCo layer recited above is obtained for the stacked film of the Fe layer and the Co layer included in the first stacked body 13 and the second stacked body 23. In other words, good lattice matching with the Heusler alloy is obtained when the first stacked body 13 and the second stacked body 23 are preferentially oriented with the (110) plane in the film surface perpendicular direction.

Accordingly, in the embodiment, it is favorable for the crystal orientation plane of the first stacked body 13 in the film surface perpendicular direction to be the cubic (110) plane. Similarly, it is favorable for the crystal orientation plane of the second stacked body 23 in the film surface perpendicular direction to be the cubic (110) plane. When the crystal orientation plane of the first stacked body 13 in the film surface perpendicular direction is the (110) plane, the crystal orientation plane of the first magnetic layer 10 in the film surface perpendicular direction is the cubic (110) plane. When the crystal orientation plane of the second stacked body 23 in the film surface perpendicular direction is the (110) plane, the crystal orientation plane of the second magnetic layer 20 in the film surface perpendicular direction is the cubic (110) plane.

In the Heusler alloy, a high degree of spin polarization is obtained in the case where there is lattice ordering of the B2 type or higher. In the case where the lattice matching is good, the ordering of an ordered alloy material such as a Heusler alloy is promoted. In other words, a template effect occurs. It is considered that the improvement effect of the MR ratio observed by using the FeCo alloy in the experimental results of the eighth to tenth samples recited above is due to the high lattice matching between the Heusler alloy and the FeCo material.

In the configuration in which the Heusler alloy layer and the FeCo alloy layer are stacked, the ordering of the crystal in the Heusler alloy layer progresses; and the improvement effect of the MR ratio is obtained in the case of a low bias voltage, that is, in the case where the effect of the spin torque on the output waveform is slight. However, the immunity to the spin torque noise is low because magnetic anisotropy is not obtained in the FeCo alloy layer.

Conversely, in the embodiment, the stacked body of the stacked films of the Fe layers and the Co layers is stacked with the Heusler alloy layer. Then, each of the thicknesses of the Fe layers and the thicknesses of the Co layers is set to be the appropriate thickness. Thereby, negative perpendicular magnetic anisotropy is obtained for the stacked body. Thereby, both the improvement effect of the MR ratio due to the template effect of good lattice matching and the improvement effect of the spin torque oscillation immunity due to the negative perpendicular magnetic anisotropy are obtained. Thereby, a highly-sensitive low-noise magnetoresistance effect element can be realized.

On the other hand, the lattice length of the (100) orientation is greatly different from the lattice length of the Heusler alloy. Therefore, there is no lattice matching; and the template effect is not obtained.

In the embodiment, the Heusler alloy layers (the first Heusler alloy layer 15 and the second Heusler alloy layer 25) include an X1-X2-X3 alloy. "X1," "X2," and "X3" represent the composition of the Heusler alloy. "X1" is Co at not less than 40 atm % and not more than 60 atm %. "X2" is at least one type of element selected from the first group consisting of Fe, Mn, Cr, and V at not less than 20 atm % and not more than 30 atm %. "X3" is at least one type of element selected from the second group consisting of Si, Al, Ge, Ga, Sn, and Sb at not less than 20 atm % and not more than 30 atm %.

For example, the composition of the element of the X2 site is set to be not less than 20 atm % and not more than 30 atm %; and the composition of the element of the X3 site is set to be not less than 20 atm % and not more than 30 atm %. Thereby, the ordered phase is formable by heat treatment at a temperature (e.g., about 300° C.) that is usable in the magnetic head manufacturing process. Thereby, a magnetoresistance effect element having a high MR ratio can be stably manufactured.

For example, a low coercive force and a high MR ratio are obtained by using the $Co_2(FeMn)Si$ alloy as the Heusler alloy layer. In the $Co_2(FeMn)Si$ alloy, Co is used at the X1 site. A configuration in which the ratio of Fe:Mn is substantially 6:4 is used at the X2 site. Si is used at the X3 site.

In the embodiment, for example, it is favorable for the ratio of X1:X2:X3 to be 2:1:1. This ratio corresponds to the stoichiometric composition.

The crystal orientation changes due to the foundation that is grown and the film that is formed on the foundation. For example, in the case where a Ag layer or a Cr layer is formed on a foundation layer of MgO, a film that is oriented in the (100) plane is obtained. Other than such a special case, generally, there are many cases where the orientation is in the (110) plane.

For example, in the case where the stacked films of the Fe layers and the Co layers are formed on a foundation layer of Ag having the (100) orientation, the orientation of the stacked films of the Fe layers and the Co layers is the (100) orientation. Other than the case of the (100) orientation obtained by using such a special foundation, the (110) orientation of the magnetic layer can be obtained by forming the magnetic layer on a foundation layer of the (110) orientation that can be obtained by using many nonmagnetic materials.

In the embodiment, the stacked body (the first stacked body 13 and the second stacked body 23 having the cubic (110) orientation) can be obtained by using a layer having the cubic (110) orientation as the foundation layer (e.g., one selected from the first shield-side conductive layer 41 and the second shield-side conductive layer 42) that is nonmagnetic. Thereby, the magnetic layers (the first magnetic layer 10 and the second magnetic layer 20) having the cubic (110) orientation are obtained. By using the stacked body having the cubic (110) orientation, both the improvement effect of the MR ratio due to the template effect and the improvement effect of the spin torque oscillation immunity due to the negative perpendicular magnetic anisotropy are obtained.

For example, it may be considered to obtain the (100) orientation of the FeCo alloy by forming an Fe atomic layer and a Co atomic layer to be one atomic layer thick each using conditions such as a designated foundation layer, designated temperatures, etc. Thereby, the B2 type structure of FeCo can be made. In such a case, an atomic-layer alternating stacked structure of a pure Fe layer and a pure Co layer is formed; and the (100) orientation is obtained.

Conversely, in the embodiment, the (110) orientation is applied rather than the B2 type structure of the (100) orientation. The structure of the (110) orientation is different from the structure formed using the method in which the atomic layers are formed one at a time as recited above.

Figure 6A:
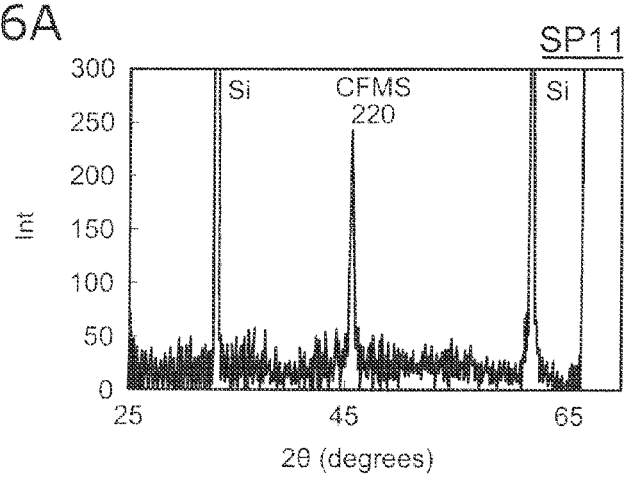
FIG. 6A to FIG. 6C are graphs illustrating characteristics of the magnetoresistance effect element.
Figure 6B:
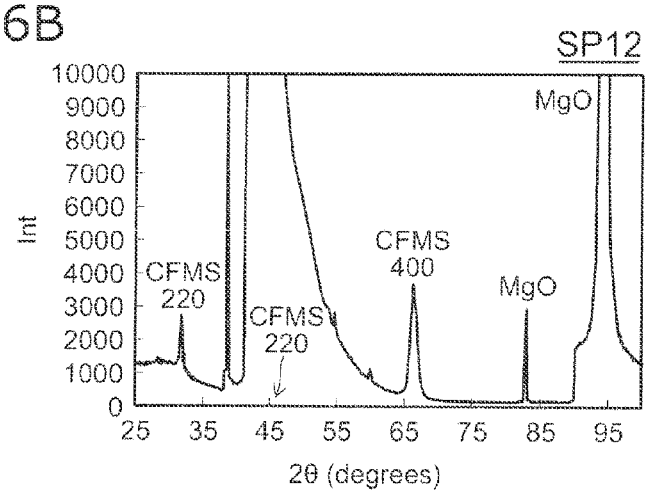
Figure 6C:
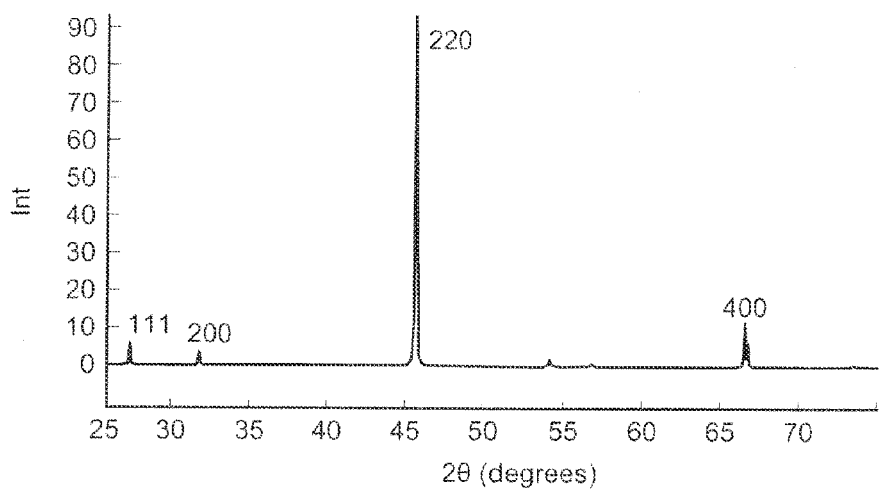

FIG. 6A to FIG. 6C are graphs illustrating characteristics of the magnetoresistance effect element.

FIG. 6A and FIG. 6B show examples of the results of X-ray diffraction (XRD) of the $Co_2(FeMn)Si$ alloy (CFMS alloy) film formed on different substrates. In an eleventh sample SP11 shown in FIG. 6A, a CFMS alloy film is formed on a Si substrate on which a thermal oxide film (a $SiO_2$ film) is provided. The Si substrate has the (110) plane orientation. In a twelfth sample SP12 shown in FIG. 6B, a CFMS alloy film is formed on a MgO substrate having the (100) plane orientation.

FIG. 6C shows simulation results of the XRD intensity pattern of the CFMS alloy. In these drawings, the horizontal axis is an angle $2\theta$ (degrees). The vertical axis is an intensity Int (arbitrary units).

For the CFMS alloy as shown in FIG. 6C, a peak corresponding to the (200) plane orientation is obtained when the angle $2\theta$ is about 32 degrees. A peak corresponding to the (220) plane orientation is obtained when the angle $2\theta$ is about 46 degrees.

For the eleventh sample SP11, it can be seen from FIG. 6A that a peak corresponding to the (220) plane orientation of the CFMS alloy is observed. Peaks due to Si which is the substrate also appear in FIG. 6A. For the eleventh sample SP11, peaks corresponding to the (200) plane orientation and the (400) plane orientation of the CFMS alloy are substantially not observed. Thus, a CFMS alloy having the (220) plane orientation is obtained for the CFMS alloy film formed on the Si substrate having the (110) plane orientation.

For the twelfth sample SP12, it can be seen from FIG. 6B that the intensity is high for the peaks corresponding to the (200) plane and the (400) plane of the CFMS alloy. Moreover, the peak corresponding to the (220) plane of the CFMS alloy is substantially not observed.

Thus, the (110) plane orientation and the (100) plane orientation can be determined by analysis such as XRD, etc.

In the embodiment, a high MR ratio can be obtained in the case where the thickness of the Heusler alloy layer is thick. Therefore, it is favorable for the thickness of the first Heusler alloy layer 15 to be 2 nm or more. Similarly, it is favorable for the thickness of the second Heusler alloy layer 25 to be 2 nm or more.

In the embodiment, the thickness of the stacked unit 10s is limited by, for example, the value of the read gap (the distance between the first shield 71 and the second shield 72) corresponding to the surface recording density of the magnetic recording medium 80 that is used. For example, in a HDD having a high recording density of 1.5 $Tb/in^2$ (terabit/square inch), a high-resolution reproducing element having a fine bit length is used. In such a case, the read gap is set to be, for example, not more than about 20 nm.

To obtain such a read gap, the thickness of the first magnetic layer 10 and the thickness of the second magnetic layer 20 are set to be, for example, 6 nm each.

In such a case, for example, the thickness of the first stacked body 13 is set to be 2 nm in the case where the thickness of the first Fe layer 11 and the thickness of the first Co layer 12 of the first stacked body 13 are set to be 0.5 nm each and the number of pairs is 2. In this configuration, in the case where the thickness of the first magnetic layer 10 is set to be 6 nm, the thickness of the first Heusler alloy layer 15 is set to be 4 nm.

In the embodiment, the read gap is set to be, for example, not less than about 16 nm and not more than about 20 nm. For example, the thickness of the first shield-side conductive layer 41 (e.g., the foundation layer) is set to be about 3 nm. The thickness of the intermediate layer 30 is set to be about 2 nm. The thickness of the second shield-side conductive layer 42 (e.g., the capping layer) is set to be about 3 nm. At this condition, the thicknesses of the first magnetic layer 10 and the second magnetic layer 20 are not less than 4 nm and not more than 6 nm each.

On the other hand, for example, the thicknesses of the first magnetic layer 10 and the second magnetic layer 20 are not more than 8 nm each in the case where the thickness of the first shield-side conductive layer 41 is set to be about 2 nm, the thickness of the intermediate layer 30 is set to be about 1 nm, and the thickness of the second shield-side conductive layer 42 is set to be about 2 nm. In such a case, the read gap is set to be about 21 nm. According to the read gap, a reproduction resolution that is substantially 1.5 Tb/in$^2$ is obtained.

FIG. 7A to FIG. 7F are schematic cross-sectional views illustrating the magnetoresistance effect element according to the first embodiment.

FIG. 7A to FIG. 7F are cross-sectional views illustrating portions of the cross section corresponding to line A1-A2 of FIG. 1A.

These drawings show examples of stacked structures of the first magnetic layer 10 or the second magnetic layer 20.

Figure 7A:
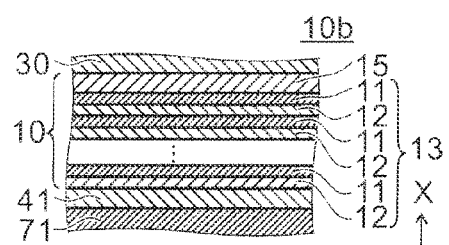
FIG. 7A to FIG. 7F are schematic cross-sectional views illustrating the magnetoresistance effect element according to the first embodiment.

As shown in FIG. 7A, the first magnetic layer 10 has a third stacked configuration 10b. In the third stacked configuration 10b, the first Heusler alloy layer 15 is disposed between the first stacked body 13 and the intermediate layer 30. The first Co layer 12 is disposed at the position of the first stacked body 13 most proximal to the first shield 71. The first Fe layer 11 is disposed at the position of the first stacked body 13 most proximal to the intermediate layer 30. In the example, the first shield-side conductive layer 41 is provided; and the first shield-side conductive layer 41 contacts the first shield 71 and one of the first Co layers 12. The first Heusler alloy layer 15 contacts the intermediate layer 30 and one of the first Fe layers 11.

Figure 7B:
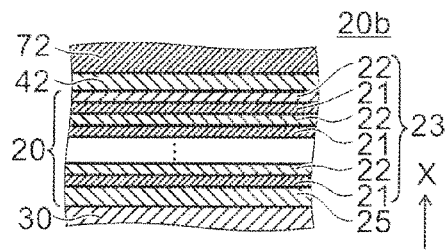

As shown in FIG. 7B, the second magnetic layer 20 has a fourth stacked configuration 20b. In the fourth stacked configuration 20b, the second Heusler alloy layer 25 is disposed between the second stacked body 23 and the intermediate layer 30. The second Co layer 22 is disposed at the position of the second stacked body 23 most proximal to the second shield 72. The second Fe layer 21 is disposed at the position of the second stacked body 23 most proximal to the intermediate layer 30. In the example, the second shield-side conductive layer 42 is provided; and the second shield-side conductive layer 42 contacts the second shield 72 and one of the second Co layers 22. The second Heusler alloy layer 25 contacts the intermediate layer 30 and one of the second Fe layers 21.

Figure 7C:
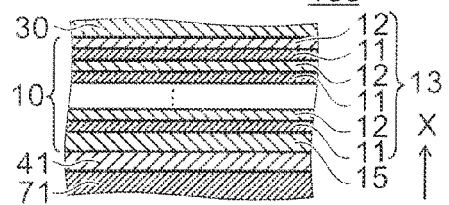

As shown in FIG. 7C, the first magnetic layer 10 has a fifth stacked configuration 10c. In the fifth stacked configuration 10c, the first Heusler alloy layer 15 is disposed between the first stacked body 13 and the first shield 71. The first Fe layer 11 is disposed at the position of the first stacked body 13 most proximal to the first shield 71. The first Co layer 12 is disposed at the position of the first stacked body 13 most proximal to the intermediate layer 30. In the example, the first shield-side conductive layer 41 is provided; and the first shield-side conductive layer 41 contacts the first shield 71 and the first Heusler alloy layer 15. The intermediate layer 30 contacts one of the first Co layers 12.

Figure 7D:
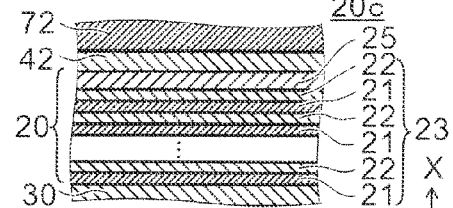

As shown in FIG. 7D, the second magnetic layer 20 has a sixth stacked configuration 20c. In the sixth stacked configuration 20c, the second Heusler alloy layer 25 is disposed between the second stacked body 23 and the second shield 72. The second Co layer 22 is disposed at the position of the second stacked body 23 most proximal to the second shield 72. The second Fe layer 21 is disposed at the position of the second stacked body 23 most proximal to the intermediate layer 30. In the example, the second shield-side conductive layer 42 is provided; and the second shield-side conductive layer 42 contacts the second shield 72 and the second Heusler alloy layer 25. The intermediate layer 30 contacts one of the second Fe layers 21.

Figure 7E:
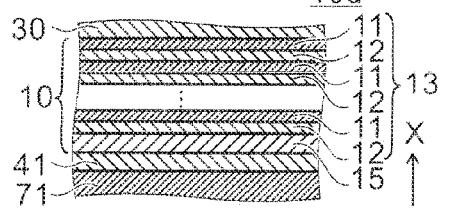

As shown in FIG. 7E, the first magnetic layer 10 has a seventh stacked configuration 10d. In the seventh stacked configuration 10d, the first Heusler alloy layer 15 is disposed between the first stacked body 13 and the first shield 71. The first Co layer 12 is disposed at the position of the first stacked body 13 most proximal to the first shield 71. The first Fe layer 11 is disposed at the position of the first stacked body 13 most proximal to the intermediate layer 30. In the example, the first shield-side conductive layer 41 is provided; and the first shield-side conductive layer 41 contacts the first shield 71 and the first Heusler alloy layer 15. The intermediate layer 30 contacts one of the first Fe layers 11.

Figure 7F:
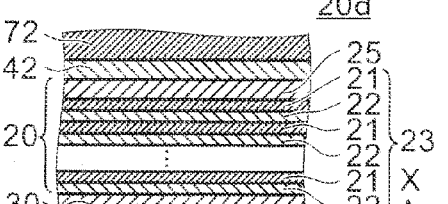

As shown in FIG. 7F, the second magnetic layer 20 has an eighth stacked configuration 20d. In the eighth stacked configuration 20d, the second Heusler alloy layer 25 is disposed between the second stacked body 23 and the second shield 72. The second Fe layer 21 is disposed at the position of the second stacked body 23 most proximal to the second shield 72. The second Co layer 22 is disposed at the position of the second stacked body 23 most proximal to the intermediate layer 30. In the example, the second shield-side conductive layer 42 is provided; and the second shield-side conductive layer 42 contacts the second shield 72 and the second Heusler alloy layer 25. The intermediate layer 30 contacts one of the second Co layers 22.

The stacked structure of the Fe layer and the Co layer recited above is provided in at least one selected from the first magnetic layer 10 and the second magnetic layer 20. One selected from the first stacked configuration 10a, the third stacked configuration 10b, the fifth stacked configuration 10c, and the seventh stacked configuration 10d may be combined with one selected from the second stacked configuration 20a, the fourth stacked configuration 20b, the sixth stacked configuration 20c, and the eighth stacked configuration 20d.

It is favorable to combine one selected from the first stacked configuration 10a, the third stacked configuration 10b, the fifth stacked configuration 10c, and the seventh stacked configuration 10d with one selected from the second stacked configuration 20a, the fourth stacked configuration 20b, the sixth stacked configuration 20c, and the eighth stacked configuration 20d. Thereby, higher spin torque immunity is obtained.

Figure 8:
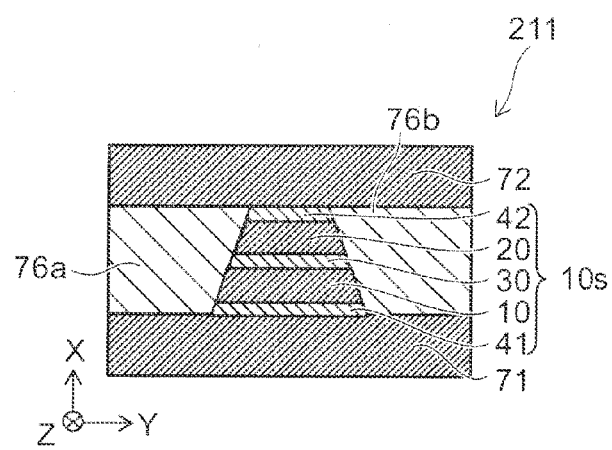
FIG. 8 is a schematic view illustrating another magnetoresistance effect element according to the first embodiment.

FIG. 8 is a schematic view illustrating another magnetoresistance effect element according to the first embodiment.

FIG. 8 is a cross-sectional view corresponding to line A1-A2 of FIG. 1A.

As shown in FIG. 8, the magnetoresistance effect element 211 according to the embodiment further includes a first side shield 76a and a second side shield 76b. Otherwise, the configuration is similar to that of the magnetoresistance effect element 210; and a description is therefore omitted.

The first side shield 76a and the second side shield 76b are provided between the first shield 71 and the second shield 72. The second side shield 76b is separated from the first side shield 76a in the Y-axis direction. The Y-axis direction is a direction intersecting the X-axis direction (the first direction) and intersecting the Z-axis direction (the second direction).

The stacked unit 10s is disposed between the first side shield 76a and the second side shield 76b. The first side shield 76a and the second side shield 76b are disposed respectively at two end portions of the MR film (the stacked unit 10s) in the track width direction.

The first side shield 76a and the second side shield 76b include, for example, a NiFe alloy, etc. For example, the noise from the track width-direction end portions can be suppressed by the first side shield 76a and the second side shield 76b.

In the embodiment, the spin torque noise can be suppressed if a stacked film having one or more pairs of the Fe layer and the Co layer exists. The spin torque noise can be suppressed more effectively by providing the stacked body of the Fe layer and the Co layer in both the first magnetic layer 10 and the second magnetic layer 20. A bcc lattice is stably obtained in the case where the ratio of Fe in the Fe and the Co is not less than 40% and not more than 95% of the entirety.

Second Embodiment

Figure 9:
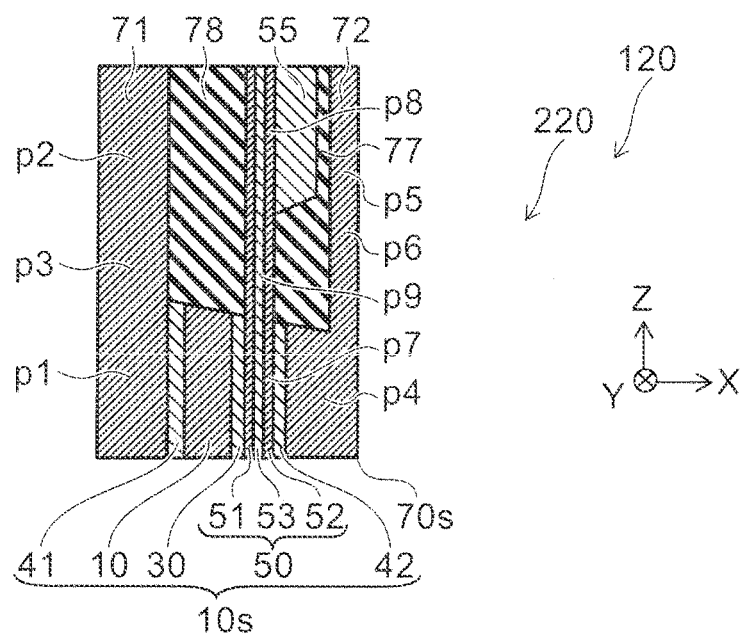
FIG. 9 is a schematic cross-sectional view illustrating a magnetoresistance effect element according to a second embodiment.

FIG. 9 is a schematic cross-sectional view illustrating a magnetoresistance effect element according to a second embodiment.

As shown in FIG. 9, the magnetoresistance effect element 220 according to the embodiment includes the first shield 71, the second shield 72, the first magnetic layer 10, a second magnetic layer 50, the intermediate layer 30, an antiferromagnetic layer 55, and an insulating layer (a first insulating layer 77). In the example, a first shield-side insulating layer (a second insulating layer 78) is further provided. Such a magnetoresistance effect element 210 is used in a magnetic head 120.

The first shield 71 has a first portion p1, a second portion p2, and a third portion p3. The second portion p2 is separated from the first portion p1 in the first direction. In the embodiment, the first direction is taken as the Z-axis direction. The third portion p3 is provided between the first portion p1 and the second portion p2.

In the embodiment, one direction perpendicular to the Z-axis direction is taken as the Y-axis direction. A direction perpendicular to the Z-axis direction and the Y-axis direction is taken as the X-axis direction.

The second shield 72 has a fourth portion p4, a fifth portion p5, and a sixth portion p6. The fourth portion p4 is separated from the first portion p1 in the second direction. The second direction is a direction intersecting the first direction (the Z-axis direction). In the example, the second direction is taken as the X-axis direction. The fifth portion p5 is separated from the fourth portion p4 in the first direction (the Z-axis direction) and separated from the second portion p2 in the second direction (the X-axis direction). The sixth portion p6 is provided between the fourth portion p4 and the fifth portion p5.

The first magnetic layer 10 is provided between the first portion p1 and the fourth portion p4. The orientation of the magnetization of the first magnetic layer 10 is changeable.

The second magnetic layer 50 has a seventh portion p7, an eighth portion p8, and a ninth portion p9. The seventh portion p7 is provided between the first magnetic layer 10 and the fourth portion p4. The eighth portion p8 is provided between the second portion p2 and the fifth portion p5. The ninth portion p9 is provided between the third portion p3 and the sixth portion p6.

The intermediate layer 30 is provided between the first magnetic layer 10 and the seventh portion p7. The antiferromagnetic layer 55 is provided between the eighth portion p8 and the fifth portion p5. The first insulating layer 77 is provided between the antiferromagnetic layer 55 and the fifth portion p5. In the example, the first insulating layer 77 extends between the ninth portion p9 and the sixth portion p6.

The first shield-side insulating layer (the second insulating layer 78) is provided between the third portion p3 and the ninth portion p9 and between the second portion p2 and the eighth portion p8.

In the example, the first shield-side conductive layer 41 is provided between the first portion p1 and the first magnetic layer 10. The second shield-side conductive layer 42 is provided between the seventh portion p7 and the fourth portion p4.

The stacked unit 10s includes, for example, the first shield-side conductive layer 41, the first magnetic layer 10, the intermediate layer 30, the seventh portion p7, and the second shield-side conductive layer 42. For example, by appropriately setting the material and thickness of the first shield-side conductive layer 41, the first magnetic layer 10 and the first shield 71 may have exchange coupling. The first magnetic layer 10 and the first shield 71 may not have exchange coupling.

In the example, the first magnetic layer 10 functions as, for example, a magnetization free layer. The second magnetic layer 50 functions as a magnetization fixed layer.

The configurations described in regard to the first embodiment are applicable to the first shield 71, the second shield 72, the intermediate layer 30, the first shield-side conductive layer 41, and the second shield-side conductive layer 42 of the embodiment.

The antiferromagnetic layer 55 includes, for example, IrMn, etc. The thickness of the antiferromagnetic layer 55 is, for example, not less than 5 nm and not more than 8 nm.

The first insulating layer 77 and the second insulating layer 78 include a metal oxide, a metal nitride, a metal oxynitride, etc.

The configuration described in regard to the first embodiment is applicable to the first magnetic layer 10. In other words, the crystal orientation plane of the first magnetic layer 10 in the film surface perpendicular direction is the cubic (110) plane. The first magnetic layer 10 includes the first stacked body 13 and the first Heusler alloy layer 15. The first stacked body 13 includes the first Fe layer 11 and the first Co layer 12. The first Fe layer 11 and the first Co layer 12 are stacked with each other along the second direction (corresponding to the direction from the first magnetic layer 10 toward the seventh portion p7). In the case where the multiple first Fe layers 11 and the multiple first Co layers 12 are provided, the multiple first Fe layers 11 and the multiple first Co layers 12 are stacked alternately along the second direction (the X-axis direction). The first Heusler alloy layer 15 is stacked with the first stacked body 13 along the second direction. The thickness of each of the multiple first Fe layers 11 is not less than 0.3 nm and not more than 0.6 nm. The thickness of each of the multiple first Co layers 12 is not less than 0.3 nm and not more than 0.6 nm.

In the magnetoresistance effect element 220 according to the embodiment as well, the first stacked body 13 of the stacked films of the first Fe layers 11 and the first Co layers 12 is stacked with the first Heusler alloy layer 15. The first Heusler alloy layer 15 contacts the first stacked body 13. The thickness of the first Fe layer 11 and the thickness of the first Co layer 12 are set to the appropriate thicknesses. Thereby, negative perpendicular magnetic anisotropy is obtained for the first stacked body 13. Thereby, both the improvement effect of the MR ratio due to the template effect of good lattice matching and the improvement effect of the spin torque oscillation immunity due to the negative perpendicular magnetic anisotropy are obtained. Thereby, a highly-sensitive low-noise magnetoresistance effect element can be realized.

In the example, the antiferromagnetic layer 55 controls the magnetization of the second magnetic layer 50. Therefore, the magnetization of the second magnetic layer 50 changes less easily than the magnetization of the first magnetic layer 10. Thereby, the second magnetic layer 50 functions as a magnetization fixed layer.

In the example, the second magnetic layer 50 includes a first magnetic film 51, a second magnetic film 52, and an intermediate film 53. The first magnetic film 51 is provided between the first shield 71 and the second shield 72; and the first magnetic film 51 has the first magnetization direction. The second magnetic film 52 is provided between the first magnetic film 51 and the second shield 72. The second magnetic film 52 has the second magnetization direction that is reversely oriented with respect to the first magnetization direction. The intermediate film 53 is provided between the first magnetic film 51 and the second magnetic film 52.

In the example as well, it is favorable for the thickness of the first magnetic layer 10 to be set to be not less than 2.6 nm and not more than 8 nm. It is favorable for the thickness of the first Heusler alloy layer 15 to be set to be not less than 2 nm and not more than 7.4 nm.

The first Heusler alloy layer 15 includes Co, the first element that is at least one selected from the first group consisting of Fe, Mn, Cr, and V, and the second element that is at least one selected from the second group consisting of Si, Al, Ge, Ga, Sn, and Sb. The composition ratio of Co in the first Heusler alloy layer 15 is not less than 40 atm % and not more than 60 atm %.

The composition ratio of the first element recited above in the first Heusler alloy layer 15 is not less than 20 atm % and not more than 30 atm %. The composition ratio of the second element recited above in the first Heusler alloy layer 15 is not less than 20 atm % and not more than 30 atm %.

Third Embodiment

The embodiment relates to a magnetic head assembly and a magnetic recording and reproducing device that use the magnetoresistance effect element and the magnetic head according to the first and second embodiments.

Figure 10:
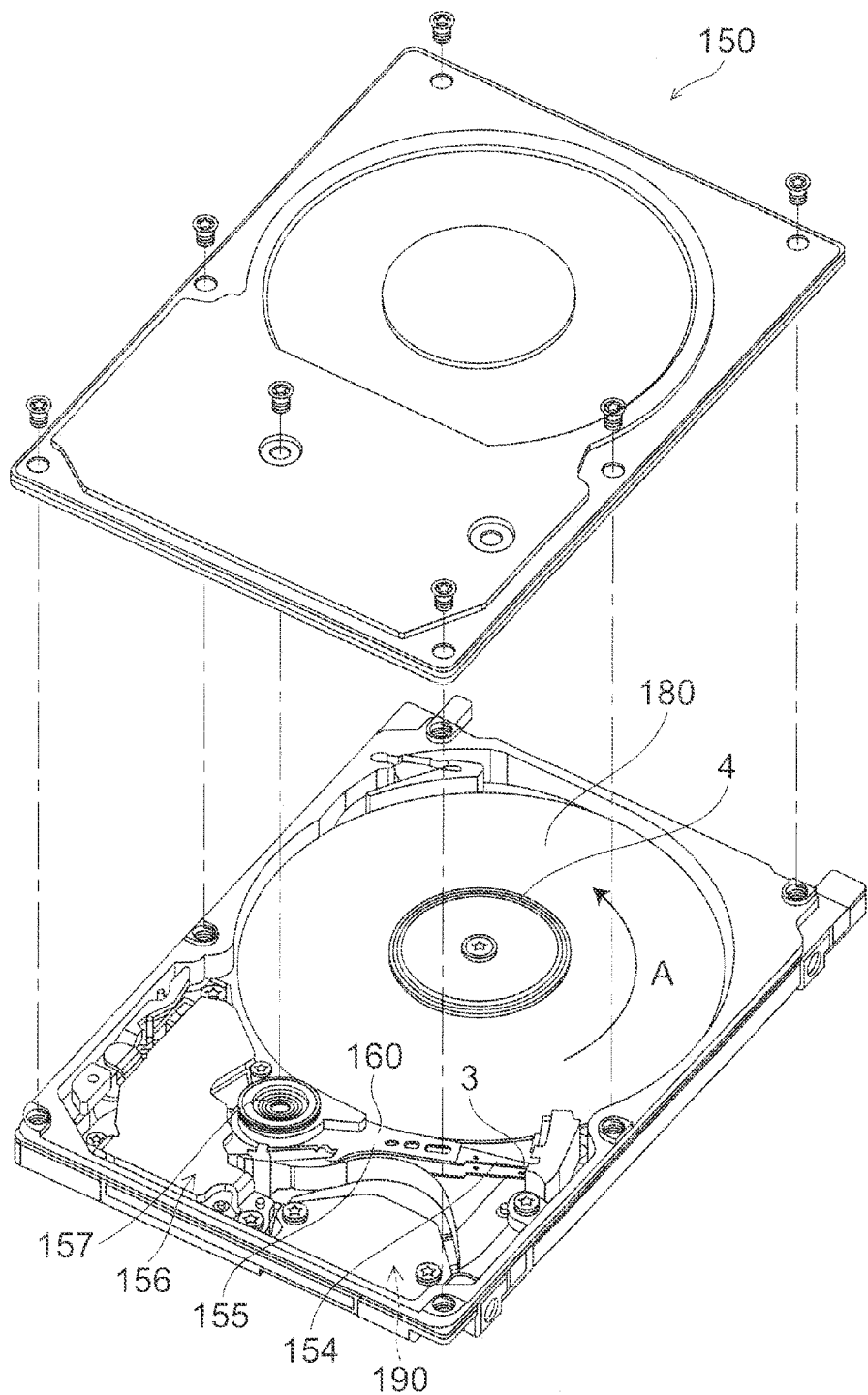
FIG. 10 is a schematic perspective view illustrating the magnetic recording and reproducing device according to the third embodiment.

FIG. 10 is a schematic perspective view illustrating the magnetic recording and reproducing device according to the third embodiment.

Figure 11A:
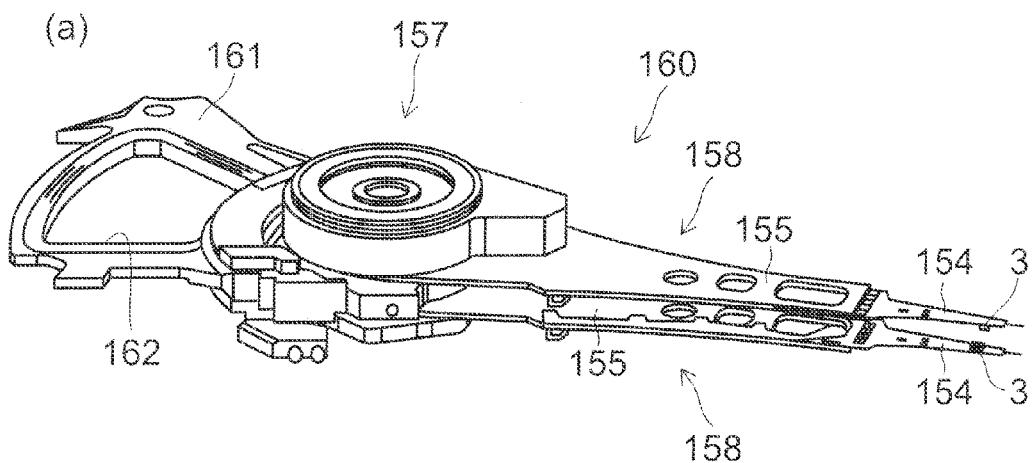
FIG. 11A and FIG. 11B are schematic perspective views illustrating portions of the magnetic recording device according to the third embodiment.
Figure 11B:
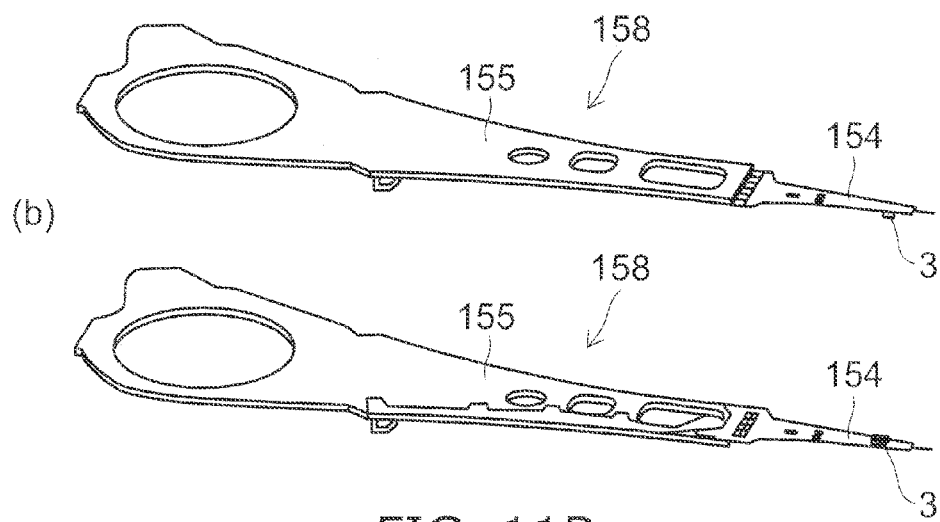

FIG. 11A and FIG. 11B are schematic perspective views illustrating portions of the magnetic recording and reproducing device according to the third embodiment.

As shown in FIG. 10, the magnetic recording and reproducing device 150 according to the embodiment is a device that uses a rotary actuator. A recording medium disk 180 is mounted to a spindle motor 4. The recording medium disk 180 is rotated in the direction of arrow A by a not-shown motor. The motor responds to, for example, a control signal from a not-shown drive apparatus controller. The magnetic recording and reproducing device 150 according to the embodiment may include multiple recording medium disks 180.

The recording/reproducing of the information stored in the recording medium disk 180 is performed by the head slider 3. The head slider 3 has the configuration described above. The head slider 3 is mounted to the tip of a suspension 154. The suspension 154 has a thin-film configuration. For example, the magnetic head (e.g., the magnetic head 110) according to the embodiment described above or a modification of the magnetic head is mounted at the vicinity of the tip of the head slider 3. The magnetic head may be the magnetoresistance effect elements according to the first and second embodiments or a magnetoresistance effect element of a modification of these elements.

When the recording medium disk 180 rotates, the head slider 3 is held above the surface of the recording medium disk 180. In other words, the downward pressure due to the suspension 154 is balanced by the pressure generated by the medium-opposing surface of the head slider 3. Thereby, the distance between the medium-opposing surface of the head slider 3 and the surface of the recording medium disk 180 is maintained at a prescribed value. In the embodiment, a so-called contact-sliding head slider 3 that contacts the recording medium disk 180 may be used.

The suspension 154 is connected to one end of an actuator arm 155. The actuator arm 155 includes, for example, a bobbin unit that holds a not-shown drive coil, etc. A voice coil motor 156 is provided at the other end of the actuator arm 155. The voice coil motor 156 is, for example, one type of linear motor. The voice coil motor 156 may include, for example, a not-shown drive coil and a not-shown magnetic circuit. For example, the drive coil is wound onto the bobbin unit of the actuator arm 155. The magnetic circuit may include, for example, a not-shown permanent magnet and a not-shown opposing yoke. The permanent magnet and the opposing yoke oppose each other; and the drive coil is disposed between the permanent magnet and the opposing yoke.

The actuator arm 155 is held by, for example, not-shown ball bearings. The ball bearings are provided, for example, at two locations on and under a bearing unit 157. The voice coil motor 156 can cause the actuator arm 155 to rotate and slide unrestrictedly. As a result, the magnetic head can be moved to any position of the recording medium disk 180.

FIG. 11A illustrates the configuration of a portion of the magnetic recording and reproducing device and is an enlarged perspective view of a head stack assembly 160.

FIG. 11B is a perspective view illustrating a magnetic head assembly (a head gimbal assembly (HGA)) 158 which is a portion of the head stack assembly 160.

As shown in FIG. 11A, the head stack assembly 160 includes the bearing unit 157, the head gimbal assembly 158, and a support frame 161. The head gimbal assembly 158 extends from the bearing unit 157. The support frame 161 extends from the bearing unit 157 in the direction opposite to the HGA. The support frame 161 supports a coil 162 of the voice coil motor.

As shown in FIG. 11B, the head gimbal assembly 158 includes the actuator arm 155 and the suspension 154. The actuator arm 155 extends from the bearing unit 157. The suspension 154 extends from the actuator arm 155.

The head slider 3 is mounted to the tip of the suspension 154. The magnetic head according to the embodiment or a modification of the magnetic head is mounted to the head slider 3.

In other words, the magnetic head assembly (the head gimbal assembly) 158 according to the embodiment includes the magnetic head according to the embodiment, the head slider 3 to which the magnetic head is mounted, the suspension 154 that has the head slider 3 mounted to one end of the suspension 154, and the actuator arm 155 that is connected to the other end of the suspension 154.

The suspension 154 includes lead wires (not shown) for writing and reproducing signals, for a heater to adjust the fly height, etc. The lead wires are electrically connected to the electrodes of the magnetic head included in the head slider 3.

A signal processor 190 is provided to write and reproduce the signals to and from the magnetic recording medium by using the magnetic head.

The signal processor 190 is provided, for example, on the back surface side of the drawing of the magnetic recording and reproducing device 150 illustrated in FIG. 10. Input/output lines of the signal processor 190 are electrically connected to the magnetic head by being connected to electrode pads of the head gimbal assembly 158.

In other words, the signal processor 190 is electrically connected to the magnetic head.

The change of the resistance of the stacked unit 10s of the magnetic head corresponding to the medium magnetic field recorded in the magnetic recording medium 80 is sensed by, for example, the signal processor 190.

Thus, the magnetic recording and reproducing device 150 according to the embodiment includes a magnetic recording medium, the magnetic head according to the embodiment recited above, a movable portion that is relatively movable in a state in which the magnetic recording medium and the magnetic head are separated from each other or in a state in which the magnetic recording medium and the magnetic head contact each other, a position control unit that aligns the magnetic head at a prescribed recording position of the magnetic recording medium, and a signal processor that writes and reproduces signals to and from the magnetic recording medium by using the magnetic head.

In other words, the recording medium disk 180 is used as the magnetic recording medium 80 recited above. The movable portion recited above may include the head slider 3.

The position control unit recited above may include the head gimbal assembly 158.

Thus, the magnetic recording and reproducing device 150 according to the embodiment includes the magnetic recording medium, the magnetic head assembly according to the embodiment, and the signal processor 190 that writes and reproduces signals to and from the magnetic recording medium by using the magnetic head mounted to the magnetic head assembly.

According to the magnetic recording and reproducing device 150 according to the embodiment, high reproduction resolution and low noise reproduction are possible by using the magnetic head according to the embodiment recited above.

According to the embodiments, a magnetoresistance effect element, a magnetic head, a magnetic head assembly, and a magnetic recording and reproducing device having high reproduction resolution and low noise can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetoresistance effect element, the magnetic head, the magnetic head assembly, and the magnetic recording and reproducing device such as the first shield, the second shield, the first magnetic layer, the second magnetic layer, the stacked body, the Fe layer, the Co layer, the Heusler alloy layer, the intermediate layer, the first shield-side conductive layer, the second shield-side conductive layer, the insulating unit, the antiferromagnetic layer, the insulating layer, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all magnetoresistance effect elements, magnetic heads, magnetic head assemblies, and magnetic recording and reproducing devices practicable by an appropriate design modification by one skilled in the art based on the magnetoresistance effect elements, the magnetic heads, the magnetic head assemblies, and the magnetic recording and reproducing devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetoresistance effect element, comprising:
a first shield;
a second shield separated from the first shield in a first direction;
a stacked unit including
    a first magnetic layer provided between the first shield and the second shield, a magnetization of the first magnetic layer being changeable,
    a second magnetic layer provided between the first magnetic layer and the second shield, a magnetization of the second magnetic layer being changeable, and
    an intermediate layer provided between the first magnetic layer and the second magnetic layer; and
a hard bias unit provided between the first shield and the second shield to be arranged with the stacked unit in a second direction intersecting the first direction,
a crystal orientation plane of the first magnetic layer in a film surface perpendicular direction being a cubic (110) plane,
the first magnetic layer including
    a first stacked body including a first Fe layer and a first Co layer stacked with the first Fe layer along the first direction, and
    a first Heusler alloy layer stacked with the first stacked body along the first direction,
a thickness of the first Fe layer being not less than 0.3 nanometers and not more than 0.6 nanometers,
a thickness of the first Co layer being not less than 0.3 nanometers and not more than 0.6 nanometers.

2. The element according to claim 1, wherein
a crystal orientation plane of the second magnetic layer in the film surface perpendicular direction is the cubic (110) plane,
the second magnetic layer includes a second stacked body including a second Fe layer and a second Co layer stacked with the second Fe layer along the first direction, and
a second Heusler alloy layer stacked with the second stacked body along the first direction,
a thickness of the second Fe layer is not less than 0.3 nanometers and not more than 0.6 nanometers, and
a thickness of the second Co layer is not less than 0.3 nanometers and not more than 0.6 nanometers.

3. The element according to claim 2, wherein a thickness of the second magnetic layer is not less than 2.6 nanometers and not more than 8 nanometers.

4. The element according to claim 2, wherein a thickness of the second Heusler alloy layer is not less than 2 nanometers and not more than 7.4 nanometers.

5. The element according to claim 2, wherein the second Heusler alloy layer contacts the second stacked body.

6. The element according to claim 2, further comprising a second shield-side conductive layer provided between the second magnetic layer and the second shield,
the second magnetic layer and the second shield being capable to be exchange coupled.

7. A magnetoresistance effect element, comprising:
a first shield including
a first portion,
a second portion separated from the first portion in a first direction, and
a third portion provided between the first portion and the second portion;
a second shield including
a fourth portion separated from the first portion in a second direction intersecting the first direction,
a fifth portion separated from the fourth portion in the first direction and separated from the second portion in the second direction, and
a sixth portion provided between the fourth portion and the fifth portion;
a first magnetic layer provided between the first portion and the fourth portion, a magnetization of the first magnetic layer being changeable;
a second magnetic layer including
a seventh portion provided between the first magnetic layer and the fourth portion,
an eighth portion provided between the second portion and the fifth portion, and
a ninth portion provided between the third portion and the sixth portion;
an intermediate layer provided between the first magnetic layer and the seventh portion;
an antiferromagnetic layer provided between the eighth portion and the fifth portion; and
an insulating layer provided between the antiferromagnetic layer and the fifth portion,
a crystal orientation plane of the first magnetic layer in a film surface perpendicular direction being a cubic (110) plane,
the first magnetic layer including
a first stacked body including a first Fe layer and a first Co layer stacked with the first Fe layer along the second direction, and
a first Heusler alloy layer stacked with the first stacked body along the second direction,
a thickness of the first Fe layer being not less than 0.3 nanometers and not more than 0.6 nanometers,
a thickness of the first Co layer being not less than 0.3 nanometers and not more than 0.6 nanometers.

8. The element according to claim 7, wherein the insulating layer extends between the ninth portion and the sixth portion.

9. The element according to claim 7, wherein the second magnetic layer includes
a first magnetic film provided between the first shield and the second shield, the first magnetic film having a first magnetization,
a second magnetic film provided between the first magnetic film and the second shield, the second magnetic film having a second magnetization, the second magnetization being reverse with respect to the first magnetization, and
an intermediate film provided between the first magnetic film and the second magnetic film.

10. The element according to claim 1, wherein a thickness of the first magnetic layer is not less than 2.6 nanometers and not more than 8 nanometers.

11. The element according to claim 1, wherein a thickness of the first Heusler alloy layer is not less than 2 nanometers and not more than 7.4 nanometers.

12. The element according to claim 1, wherein the first Heusler alloy layer contacts the first stacked body.

13. The element according to claim 1, wherein
the first Heusler alloy layer includes
Co;
a first element being at least one selected from a first group consisting of Fe, Mn, Cr, and V; and
a second element being at least one selected from a second group consisting of Si, Al, Ge, Ga, Sn, and Sb, and
a composition ratio of Co in the first Heusler alloy layer is not less than 40 atomic percent and not more than 60 atomic percent.

14. The element according to claim 13, wherein a composition ratio of the first element in the first Heusler alloy layer is not less than 20 atomic percent and not more than 30 atomic percent.

15. The element according to claim 13, wherein a composition ratio of the second element in the first Heusler alloy layer is not less than 20 atomic percent and not more than 30 atomic percent.

16. The element according to claim 1, further comprising a first shield-side conductive layer provided between the first magnetic layer and the first shield,
the first magnetic layer and the first shield being capable to be exchange coupled.

17. A magnetic head, comprising the element according to claim 1.

18. A magnetic head assembly, comprising:
the magnetic head according to claim 17;
a suspension configured to have the magnetic head mounted to one end of the suspension; and
an actuator arm connected to one other end of the suspension.

19. A magnetic recording and reproducing device, comprising:
the magnetic head assembly according to claim 18; and
a magnetic recording medium including information configured to be reproduced using the magnetic head mounted in the magnetic head assembly.

* * * * *